United States Patent
Xue et al.

(10) Patent No.: US 12,410,506 B2
(45) Date of Patent: Sep. 9, 2025

(54) MASK AND METHOD FOR MANUFACTURING SAME, DISPLAY PANEL, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Longhui Xue, Beijing (CN); Wei Zhang, Beijing (CN); Weiyun Huang, Beijing (CN); Songlv Qin, Beijing (CN); Rui Zhou, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 911 days.

(21) Appl. No.: 17/599,587

(22) PCT Filed: Oct. 28, 2020

(86) PCT No.: PCT/CN2020/124492
§ 371 (c)(1),
(2) Date: Sep. 29, 2021

(87) PCT Pub. No.: WO2022/087906
PCT Pub. Date: May 5, 2022

(65) Prior Publication Data
US 2022/0316043 A1   Oct. 6, 2022

(51) Int. Cl.
C23C 14/04    (2006.01)
H10K 50/15    (2023.01)
(Continued)

(52) U.S. Cl.
CPC ........... *C23C 14/042* (2013.01); *H10K 50/15* (2023.02); *H10K 50/16* (2023.02); *H10K 50/81* (2023.02);
(Continued)

(58) Field of Classification Search
CPC .... C23C 14/042; H10K 59/65; H10K 59/352; H10K 59/353; H10K 50/15; H10K 50/16;
(Continued)

(56) References Cited

U.S. PATENT DOCUMENTS 7,282,240 B1 * 10/2007 Jackman ................ B82Y 40/00
427/282
2009/0309109 A1   12/2009 Chang et al.
(Continued)

FOREIGN PATENT DOCUMENTS

CN    107868931 A    4/2018
CN    208013662 U    10/2018
(Continued)

OTHER PUBLICATIONS

KR20120084251 english translation (Year: 2012).*
(Continued)

*Primary Examiner* — William B Partridge
*Assistant Examiner* — David Paul Sedorook
(74) *Attorney, Agent, or Firm* — Lippes Mathias LLP

(57) ABSTRACT

Provided is a mask, including a mask frame and a mask body including a first mask region and a second mask region; the second mask region includes a first region and a second region; the first region is provided with a plurality of first through holes, and the second region is provided with a plurality of second through holes; the first through holes and the second through holes are arranged along a row direction and a column direction; a shape of the first through hole is a first shape, a shape of the second through hole is a second (Continued)

shape, and the second shape is a centrally symmetric pattern or an axially symmetric pattern; a ratio of a number of the second through holes to a number of the first through holes is less than or equal to 35%.

19 Claims, 10 Drawing Sheets

(51) Int. Cl.
*H10K 50/16* (2023.01)
*H10K 50/81* (2023.01)
*H10K 50/82* (2023.01)
*H10K 59/35* (2023.01)
*H10K 59/65* (2023.01)
*H10K 59/80* (2023.01)
*H10K 71/00* (2023.01)

(52) U.S. Cl.
CPC ........... *H10K 50/82* (2023.02); *H10K 59/353* (2023.02); *H10K 71/00* (2023.02); *H10K 59/65* (2023.02); *H10K 59/8051* (2023.02); *H10K 59/8052* (2023.02)

(58) Field of Classification Search
CPC ........ H10K 50/81; H10K 50/82; H10K 71/00; H10K 59/8051; H10K 71/60; B05C 21/005; H01L 51/0021; H01L 27/3216; H01L 27/3218; H01L 27/3234; H01L 51/5056; H01L 51/5072; H01L 51/5206; H01L 51/5221; H01L 51/56
See application file for complete search history.

(56) References Cited

U.S. PATENT DOCUMENTS

| | | | | |
|---|---|---|---|---|
| 2014/0242737 | A1* | 8/2014 | Chung | H10K 71/00 |
| | | | | 118/504 |
| 2015/0259779 | A1* | 9/2015 | Ma | H10K 71/166 |
| | | | | 216/41 |
| 2020/0135837 | A1 | 4/2020 | Cui et al. | |
| 2020/0181754 | A1* | 6/2020 | Ye | C23C 14/042 |
| 2020/0194512 | A1* | 6/2020 | Wang | H10K 59/352 |
| 2020/0308687 | A1 | 10/2020 | Li et al. | |
| 2021/0265396 | A1* | 8/2021 | Kim | H10K 71/166 |
| 2021/0363626 | A1 | 11/2021 | Wang et al. | |

FOREIGN PATENT DOCUMENTS

| | | | | |
|---|---|---|---|---|
| CN | 109722629 | A | | 5/2019 |
| CN | 109957754 | A | | 7/2019 |
| CN | 110265461 | A | | 9/2019 |
| CN | 110760791 | A | | 2/2020 |
| CN | 110767713 | A | | 2/2020 |
| CN | 110993662 | A | | 4/2020 |
| CN | 111785742 | A | | 10/2020 |
| KR | 20120084241 | A | * 7/2012 | ......... H01L 27/0207 |
| KR | 20190090177 | A | | 8/2019 |

OTHER PUBLICATIONS

China National Intellectual Property Administration, First office action of Chinese application No. 202080002531.8 issued on Apr. 22, 2023, which is foreign counterpart application of this US application.

* cited by examiner

MASK AND METHOD FOR MANUFACTURING SAME, DISPLAY PANEL, AND DISPLAY DEVICE

CROSS-REFERENCE TO RELATED APPLICATIONS

This application is a 371 of PCT Application No. PCT/CN2020/124492, filed on Oct. 28, 2020, the disclosure of which is herein incorporated by reference in its entireties.

TECHNICAL FIELD

The present disclosure relates to the field of display technologies, and in particular, relates to a mask and a method for manufacturing the same, a display panel, and a display device.

BACKGROUND

Organic light-emitting diode (OLED) display panels are widely applied due to their advantages such as self-illuminance, low driving voltages and high response speeds.

SUMMARY

The present disclosure provides a mask and a method for manufacturing the same, a display panel and a method for manufacturing the same, and a display device. The technical solutions are as follows.

According to an aspect, a mask is provided. The mask includes: a mask frame and a mask body, wherein the mask body is fixed on the mask frame and includes a first mask region and a second mask region;
  the second mask region includes a first region and a second region; an area of the second region is smaller than an area of the first region; the second region is disposed away from a center of the second mask region relative to the first region; the first region is provided with a plurality of first through holes, and the second region is provided with a plurality of second through holes; the first through holes and the second through holes are arranged along a row direction and a column direction; each first through hole in the first region is provided with a first nearest though hole at each side in the row direction and is provided with a second nearest through hole at each side in the column direction; both the first nearest though hole and the second nearest through hole are first through holes;
  a first overlapping length is formed between the first through hole in the first region and the first nearest through hole in the column direction, the first overlapping length is greater than 70% of a length of the first through hole in the column direction; and a second overlapping length is formed between the first through hole in the first region and the second nearest through hole in the row direction, the second overlapping length is greater than 70% of a length of the first through hole in the row direction; and
  a shape of the first through hole is a first shape, a shape of the second through hole is a second shape, and the second shape is a centrally symmetric pattern or an axially symmetric pattern; a ratio of a number of the second through holes to a number of the first through holes is less than or equal to 35%; and the first through holes and the second through holes are configured to manufacture at least one film layer of sub-pixels in a display panel.

Optionally, an area of the second through hole is larger than or equal to an area of the first through hole.

Optionally, a ratio of the area of the second through hole to the area of the first through hole ranges from 1 to 3.

Optionally, the shape of the second through hole is a rectangle, and the area of the second through hole is equal to an area of a minimum circumscribed rectangle of the first through hole.

Optionally, the shape of the second through hole is one of a circle, an ellipse, a rectangle, a triangle, a trapezoid, a parallelogram, a hexagon, an octagon and a cross.

Optionally, a shape of the second mask region is a rectangle.

Optionally, the second region includes a plurality of sub-regions, each sub-region being a region proximal to a corner of the second mask region and each sub-region being provided with at least one second through hole.

Optionally, the second region includes four sub-regions, each sub-region being a region proximal to one of four corners of the second mask region,
  wherein each sub-region is provided with one second through hole.

Optionally, the second region includes a plurality of sub-regions, each sub-region being a region proximal to a midpoint of a boundary of the second mask region and each sub-region being provided with at least one second through hole.

Optionally, the second region includes two sub-regions, each sub-region being provided with one second through hole, wherein
  the two sub-regions are regions proximal to a midpoint of an upper boundary and a midpoint of a lower boundary of the second mask region respectively, or the two sub-regions are regions proximal to a midpoint of a left boundary and a midpoint of a right boundary of the second mask region respectively, Optionally, the second region includes a plurality of first sub-regions and a plurality of second sub-regions, each first sub-region being provided with at least one second through hole and each second sub-region being provided with at least one second through hole; wherein each first sub-region is a region proximal to a corner of the second mask region, and each second sub-region is a region proximal to a midpoint of a boundary of the second mask region.

Optionally, the second region includes four first sub-regions and two second sub-regions, each first sub-region being provided with one second through hole and each second sub-region being provided with one second through hole; wherein
  the four first sub-regions are regions proximal to four corners of the second mask region respectively; and the two second sub-regions are regions proximal to a midpoint of an upper boundary and a midpoint of a lower boundary of the second mask region respectively, or the four first sub-regions are regions proximal to four corners of the second mask region respectively; and the two second sub-regions are regions proximal to a midpoint of a left boundary and a midpoint of a right boundary of the second mask region respectively.

Optionally, the second region is a strip-shaped region extending along at least one of the row direction and the column direction; wherein the row direction is parallel to an upper boundary of the second mask region, and the column direction is parallel to a left boundary of the second mask region.

Optionally, the second region is a strip-shaped region extending along the row direction, and the plurality of second through holes are arranged along the row direction.

Optionally, the second region includes a third strip-shaped sub-region extending along the row direction, a fourth strip-shaped sub-region extending along the column direction, a fifth strip-shaped sub-region extending along the row direction and a sixth strip-shaped sub-region extending along the column direction;

the plurality of second through holes include a plurality of first-type second through holes disposed in the third sub-region and extending along the row direction, a plurality of second-type second through holes disposed in the fourth sub-region and extending along the column direction, a plurality of third-type second through holes disposed in the fifth sub-region and extending along the row direction and a plurality of fourth-type second through holes disposed in the sixth sub-region and extending along the column direction; and the third sub-region is close to the upper boundary of the second mask region relative to the first region; the fourth sub-region is close to the left boundary of the second mask region relative to the first region; the fifth sub-region is close to a lower boundary of the second mask region relative to the first region; and the sixth sub-region is close to a right boundary of the second mask region relative to the first region.

Optionally, a length of one of two vertical boundaries of the second mask region ranges from 2 mm to 10 mm, and a length of the other of the two vertical boundaries of the second mask region ranges from 2 mm to 15 mm.

Optionally, at least one boundary of the second mask region adjacent to the first mask region is saw-shaped.

According to another aspect, a method for manufacturing a mask is provided, applicable to a net tensioning device. The method includes:

acquiring a mask frame and a mask body; and
fixing the mask body on the mask frame,
wherein the mask body includes a first mask region and a second mask region; the second mask region includes a first region and a second region; an area of the second region is smaller than an area of the first region; the second region is disposed away from a center of the second mask region relative to the first region; the first region is provided with a plurality of first through holes, and the second region is provided with a plurality of second through holes; the first through holes and the second through holes are arranged along a row direction and a column direction; each first through hole in the first region is provided with a first nearest though hole at each side in the row direction and is provided with a second nearest through hole at each side in the column direction; both the first nearest though hole and the second nearest through hole are first through holes;

a first overlapping length is formed between the first through hole in the first region and the first nearest through hole in the column direction, the first overlapping length is greater than 70% of a length of the first through hole in the column direction; and a second overlapping length is formed between the first through hole in the first region and the second nearest through hole in the row direction, the second overlapping length is greater than 70% of a length of the first through hole in the row direction; and a shape of the first through hole is a first shape, a shape of the second through hole is a second shape, and the second shape is a centrally symmetric pattern or an axially symmetric pattern; a ratio of a number of the second through holes to a number of the first through holes is less than or equal to 35%; and the first through holes and the second through holes are configured to manufacture at least one film layer of sub-pixels in a display panel.

Optionally, fixing the mask body on the mask frame includes:

obtaining plurality pieces of positional information by acquiring positional information of each second through hole in the mask body; and fixing the mask body on the mask frame based on the plurality pieces of positional information.

According to yet another aspect, a method for manufacturing a display panel is provided. The method includes:

providing a base substrate which includes a first display region and a second display region disposed at a side of the first display region;

forming a first anode layer in the first display region, and forming a second anode layer in the second display region;

forming a first light-emitting layer in the first display region, and forming a second light-emitting layer in the second display region; and forming a first cathode layer in the first display region, and forming a second cathode layer in the second display region by using the mask as defined in any of claims 1-17, wherein the first cathode layer is formed by the first mask region in the mask; the second cathode layer includes a plurality of first cathode patterns and a plurality of second cathode patterns which are disposed at intervals; the first cathode pattern is formed by the first through holes in the mask; and the second cathode pattern is formed by the second through holes in the mask.

According to yet another aspect, a display panel manufactured by using the method as defined in the above aspect is provided. The display panel includes:

the base substrate including the first display region and the second display region disposed at the side of the first display region;

the first anode layer, the first light-emitting layer and the first cathode layer which are disposed in the first display region and are sequentially laminated away from a side of the base substrate; and the second anode layer, the second light-emitting layer and the second cathode layer which are disposed in the second display region and are sequentially laminated away from the side of the base substrate, wherein the first cathode layer is formed by the first mask region in the mask as defined in any of claims 1 to 17; the second cathode layer includes a plurality of first cathode patterns and a plurality of second cathode patterns which are disposed at intervals; the first cathode pattern is formed by the first through holes in the mask; and the second cathode pattern is formed by the second through holes in the mask.

Optionally, the first anode layer, the first light-emitting layer and the first cathode layer are capable of being divided into a plurality of first sub-pixels; and the second anode layer, the second light-emitting layer and the second cathode layer are capable of being divided into a plurality of second sub-pixels;

an orthogonal projection of the first cathode pattern on the base substrate covers an orthogonal projection of light-emitting regions of one or more second sub-pixels on the base substrate; and an orthogonal projection of the second cathode pattern on the base substrate covers an orthogonal projection of light-emitting regions of one or more second sub-pixels on the base substrate.

Optionally, the plurality of second sub-pixels are capable of being divided into a plurality of sub-pixel groups; the sub-pixel groups include the second sub-pixels; and light-emitting regions of the plurality of second sub-pixels in the sub-pixel groups are arranged in 3 rows*3 columns.

Optionally, the orthogonal projection of the first cathode pattern on the base substrate covers an orthogonal projection of one sub-pixel group on the base substrate; a shape of the first cathode pattern is a first shape formed by a plurality of straight line segments and a plurality of arcuate line segments connected end to end; and an extending direction of at least one straight line segment is parallel with an extending direction of a boundary of a light-emitting region of at least one second sub-pixel.

Optionally, the sub-pixel group includes one first-color second sub-pixel, two second-color second sub-pixels and one third-color second sub-pixel.

Optionally, for each sub-pixel group, a light-emitting region of the first-color second sub-pixel is disposed in a third row and a first column, a light-emitting region of one of the two second-color second sub-pixels is disposed in a first row and a third column, a light-emitting region of the other one of the two second-color second sub-pixels is disposed in the third row and the third column, and a light-emitting region of the third-color second sub-pixel is disposed in a second row and a second column.

Optionally, for each sub-pixel group, a light-emitting region of the first-color second sub-pixel is disposed in a second row and a third column, a light-emitting region of one of the two second-color second sub-pixels is disposed in a first row and a second column, a light-emitting region of the other one of the two second-color second sub-pixels is disposed in the third row and the second column, and a light-emitting region of the third-color second sub-pixel is disposed in the second row and the first column.

Optionally, a number of the light-emitting regions of the second sub-pixels covered by the first cathode pattern is the same as a number of the light-emitting regions of the second sub-pixels covered by the second cathode pattern.

Optionally, the second cathode layer further includes a plurality of third cathode patterns disposed at intervals, wherein a number of light-emitting regions of the second sub-pixels covered by the third cathode patterns is less than the number of the light-emitting regions of the second sub-pixels covered by the first cathode pattern, and the number of light-emitting regions of the second sub-pixels covered by the third cathode patterns is less than the number of the light-emitting regions of the second sub-pixels covered by the second cathode pattern.

Optionally, the display panel further includes a first hole transport layer and a first electron transport layer which are disposed in the first display region, and a second hole transport layer and a second electron transport layer which are disposed in the second display region, wherein the second hole transport layer includes a plurality of first hole transport patterns and a plurality of second hole transport patterns which are disposed at intervals; an area of the first hole transport patterns is smaller than or equal to an area of the first cathode pattern; an area of the second hole transport patterns is smaller than or equal to an area of the second cathode pattern;

the second electron transport layer includes a plurality of first electron transport patterns and a plurality of second electron transport patterns which are disposed at intervals; an area of the first electron transport patterns is smaller than or equal to the area of the first cathode pattern; an area of the second electron transport patterns is smaller than or equal to the area of the second cathode pattern.

According to yet another aspect, a display device is provided. The display device includes an image sensor and a display panel according to the above aspect.

The image sensor is disposed at a side, distal from the second anode layer, of the base substrate of the display panel and is disposed in the second display region of the base substrate.

BRIEF DESCRIPTION OF THE DRAWINGS

For a clearer description of the technical solutions in the embodiments of the present disclosure, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

In order to make the objectives, technical solutions and advantages of the present disclosure clearer, a further detailed description will be made to the embodiments of the present disclosure below with reference to the accompanying drawings.

In the related art, in order to increase a screen-to-body ratio of a display panel, a camera of a display device may be disposed in a display region of the display panel. The display region of the display panel includes an anode layer, a light-emitting layer and a cathode layer which are sequentially laminated in a direction away from a base substrate. The camera is disposed on a side, distal from the light-emitting layer, of the anode layer.

However, since the cathode layer affects the transmittance, the imaging effect of the camera disposed in the display region of the display panel is poor.

Figure 1:
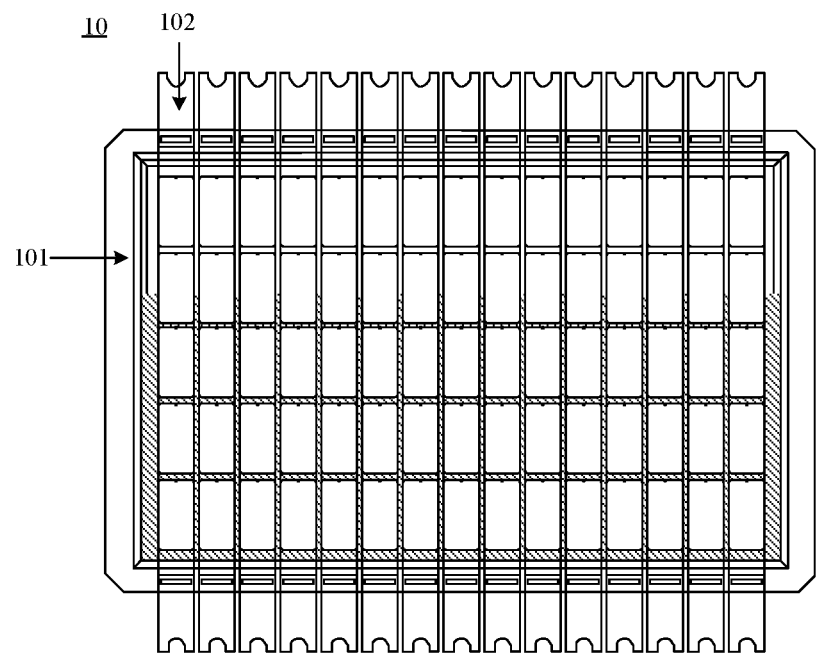
FIG. 1 is a schematic structural diagram of a mask according to an embodiment of the present disclosure.
Figure 2:
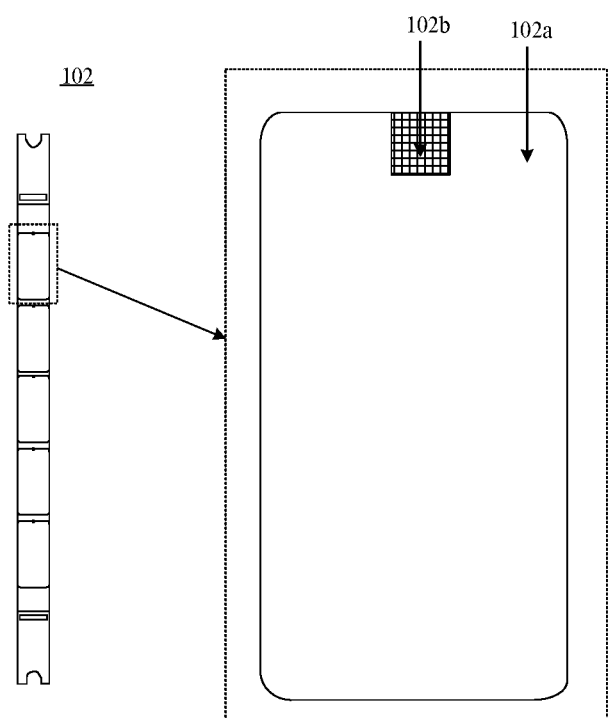
FIG. 2 is a schematic structural diagram of a mask body according to an embodiment of the present disclosure.

FIG. 1 is a schematic structural diagram of a mask according to an embodiment of the present disclosure. As can be seen from FIG. 1, the mask 10 includes a mask frame 101 and a mask body 102. The mask body 102 is fixed on the mask frame 101. FIG. 2 is a schematic structural diagram of a mask body according to an embodiment of the present disclosure. As can be seen from FIG. 2, the mask body 102 includes a first mask region 102a and a second mask region 102b.

Figure 3:
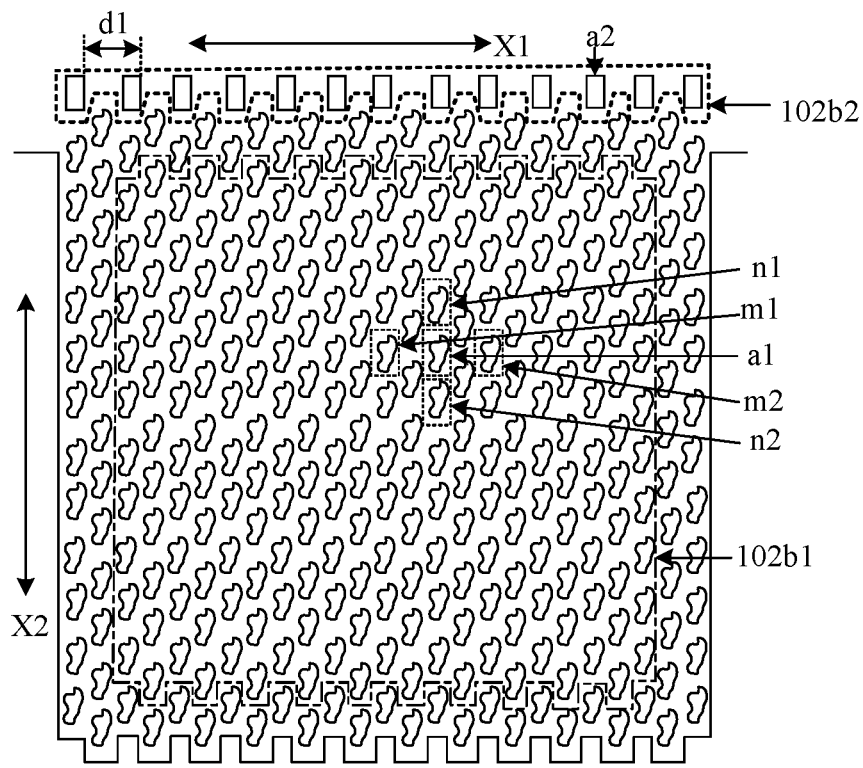
FIG. 3 is a schematic diagram of a second mask region according to an embodiment of the present disclosure.

FIG. 3 is a schematic diagram of a second mask region according to an embodiment of the present disclosure. As can be seen from FIG. 3, the second mask region 102b includes a first region 102b1 and a second region 102b2. Referring to FIG. 3, the second region 102b2 is disposed away from a center of the second mask region 102b relative to the first region 102b1. That is, the second region 102b2 is close to a boundary of the second mask region 102b relative to the first region 102b1. In addition, an area of the second region 102b2 is smaller than an area of the first region 102b1.

The first region 102b1 is provided with a plurality of first through holes a1; the second region 102b2 is provided with a plurality of second through holes a2; and the first through holes a1 and the second through holes a2 are arranged along a row direction X1 and a column direction X2. The first through holes a1 and the second through holes a2 are configured to manufacture at least one film layer of sub-pixels in the display panel. For example, the first through holes a1 and the second through holes a2 are configured to manufacture a cathode pattern of sub-pixels in the cathode layer.

Because gaps are formed among a plurality of cathode patterns formed by the plurality of first through holes a1 and the second through holes a2, the transmittance of the display panel manufactured by the mask 10 is higher, and the imaging effect of the camera is better.

In this embodiment of the present disclosure, each first through hole a1 in the first region 102b1 is provided with a first nearest though hole at each side in the row direction X1 and is provided with a second nearest through hole at each side in the column direction X2; and both the first nearest though hole and the second nearest through hole are first through holes a1.

Both the first nearest through hole and the second nearest through hole being the first through holes a1 means that a shape of the first nearest through hole and a shape of the second nearest through hole may be the same as a shape of the first through hole a1 in the first region 102b1. In addition, the first nearest through hole and the second nearest through hole may not be disposed in the first region 102b1. That is, in the second mask region 102b, other regions besides the first region 102b1 may also include first through holes a1.

In addition, with respect to each first through hole a1, two first nearest through holes (m1 and m2) and the first through hole a1 are arranged in the row direction X1. Two second nearest through holes (n1 and n2) and the first through hole a1 are arranged along the column direction X2.

In addition, with respect to each first through hole a1, the two first nearest through holes and the two second nearest through holes are not necessarily the through holes each having a smallest distance from the first through hole a1 in the first region 102b1. For example, the through holes each having the smallest distance from the first through hole a1 in the first region 102b1 are not arranged in the row direction X1 or the column direction X2 with the first through hole a1.

However, with respect to each first through hole a1, the two first nearest through holes are through holes each having a smallest distance in the row direction X1 from the first through hole a1 in the first region 102b1. That is, both a distance between the first nearest through hole m1 and the first through hole a1 in the row direction X1 and a distance between the first nearest through hole m2 and the first through hole a1 in the row direction X1 are smaller than a distance between the first through hole a1 and any of other through holes in the row direction X1, respectively. The column where the first nearest through hole is disposed is not adjacent to the column where the first through hole a1 is disposed, and there is a column of through holes between the column where the first nearest through hole is disposed and the column where the first through hole a1 is disposed.

In addition, with respect to each first through hole a1, the two second nearest through holes are through holes each having a smallest distance in the column direction X2 from the first through hole a1 in the first region 102b1. That is, both a distance between the second nearest through hole n1 and the first through hole a1 in the row direction X2 and a distance between the second nearest through hole n2 and the first through hole a1 in the column direction X2 are smaller than a distance between the first through hole a1 and any of other through holes in the column direction X2, respectively. The row where the second nearest through hole is disposed is not adjacent to the row where the first through hole a1 is disposed, and there is a row of through holes between the row where the second nearest through hole is disposed and the row where the first through hole a1 is disposed.

Optionally, the distance between the first nearest through hole m1 and the first through hole a1 in the row direction X1 is equal to the distance between the first nearest through hole m2 and the first through hole a1 in the row direction X1. The distance between the second nearest through hole n1 and the first through hole a1 in the column direction X2 is equal to the distance between the second nearest through hole n2 and the first through hole a1 in the column direction X2.

In this embodiment of the present disclosure, a first overlapping length is formed between the first through hole a1 in the first region 102b1 and the first nearest through hole (m1 or m2) in the column direction X2, the first overlapping length is greater than 70% of the length of the first through hole a1 in the column direction X2. In addition, a second overlapping length is formed between the first through hole a1 in the first region 102b1 and the second nearest through hole (n1 or n2) in the row direction X1, the second overlapping length is greater than 70% of the length of the first through hole a1 in the row direction X1.

Optionally, the first overlapping length is equal to a length of the first through hole a1 in the column direction X2. The second overlapping length is equal to a length of the first through hole a1 in the row direction X1.

In this embodiment of the present disclosure, light-emitting regions of sub-pixels in the display panel are usually not arranged regularly, such that the shapes of the through holes in the second mask region 102b are irregular shapes. The shape of the cathode pattern manufactured by the mask can also be an irregular shape, which can reduce an area of the cathode pattern and increase a transmittance of the display panel while ensuring that the cathode pattern covers a light-emitting region of a sub-pixel.

When the mask body 102 is fixed on the mask frame 101, a net tensioning device needs to acquire positional information of the through holes in the second mask region 102b, to ensure the net tensioning accuracy. However, it is usually difficult for the net tensioning to acquire positional information of irregularly-shaped through holes. Therefore, the net tensioning accuracy of the net tensioning device will be affected if the through holes in the second mask region 102b are all set as irregularly-shaped through holes.

Therefore, in this embodiment of the present disclosure, the net tensioning accuracy is ensured while the transmittance of the display panel is improved. The shape of a part of the through holes in the second mask region 102b of the mask 10 may be designed as a first shape (the first shape is an irregular shape); and the shape of the other part of the through holes is designed as a second shape (the second shape is a centrally symmetric pattern or an axially symmetric pattern). In an exemplary embodiment, referring to FIG. 3, the shape of each first through hole a1 in the first region 102b1 may be the first shape. The shape of each second through hole a2 in the second region 102b2 may be the second shape. The shape of the second through hole a2 shown in FIG. 3 is a rectangle Optionally, in order to increase the transmittance of the display panel to a greater extent, the number of the second through holes a2 of the second shape is less than the number of the first through holes a1 of the first shape. For example, a ratio of the number of the second through holes a2 to the number of the first through holes a1 is less than or equal to 35%.

In this embodiment of the present disclosure, the first mask region 102a of the mask body 102 is configured to form at least one film layer of sub-pixels of the first display region of the base substrate in the display panel. The second mask region 102b of the mask body 102 is configured to form at least one film layer of sub-pixels of the second display region of the base substrate in the display panel.

Since a region proximal to a center of the second display region of the base substrate in the display panel is usually provided with a camera, a transmittance of the display panel may be ensured to a greater extent by designing the shape of the first through hole a1 in the first region 102b1 proximal to the center of the second mask region 102b to the first shape.

In addition, when the mask body 102 is fixed on the mask frame 101 by using the net tensioning device, the net tensioning device may acquire positional information of the second through hole a2 of the centrally symmetric pattern or the axially symmetric pattern, and can fix the mask body on the mask frame based on the positional information of the second through hole a2, thereby ensuring the net tensioning accuracy of the second through hole a2. In the mask body 102, a relative position of the first through hole a1 and the second through hole a2 is fixed. Therefore, in the case where the net tensioning accuracy of the second through hole a2 is better, the net tensioning accuracy of the first through hole a1 is also better, thereby ensuring a yield of the display panel manufactured by using the mask 10.

In summary, the embodiment of the present disclosure provides a mask, gaps are formed among first through holes in a first region of the mask and among second through holes in a second region of the mask. Therefore, there are gaps among a plurality of cathode patterns in the display panel manufactured by using the mask, such that a transmittance of the display panel is higher, and an imaging effect of a camera is better. In addition, since the shape of the second through hole is a centrally symmetric pattern or an axially symmetric pattern, the net tensioning device can acquire position informational of the second through hole, and can fix a mask body on a mask frame based on the positional information of the second through hole, so as to ensure the net tensioning accuracy of the net tensioning device, thereby ensuring a yield of the display panel manufactured by using the mask.

In this embodiment of the present disclosure, the shape of the second through hole a2 may be one of a circle, an ellipse, a rectangle, a triangle, a trapezoid, a parallelogram, a hexagon, an octagon and a cross. In an exemplary embodiment, the shape of each second through hole a2 shown in FIG. 3 is a rectangle.

Of course, in the second region 101b of the mask 10, there may be at least two second through holes a2 with different shapes. For example, the shape of a part of the second through holes a2 in the second region 101b is a rectangle, and the shape of the other part of the second through holes a2 is a hexagon. In this embodiment of the present disclosure, the shape of the plurality of second through holes a2 is not limited, as long as it is ensured that the shape of each second through hole a2 is a centrally symmetric pattern or an axially symmetric pattern.

In this embodiment of the present disclosure, the plurality of second through holes a2 in the second region 102b2 may be arranged uniformly. Therefore, the net tensioning device may acquire positional information of the plurality of uniformly-arranged second through holes a2, which can improve the net tensioning accuracy of the net tensioning device.

The uniform arrangement of the plurality of second through holes a2 may mean that the plurality of second through holes a2 is arranged in the second region 102b2 uniformly. Since the second region 102b2 is close to the boundary of the second mask region 102b relative to the first region 102b1, the plurality of second through holes a2 may be arranged uniformly in a region, proximal to the boundary, of the second mask region 102b. In addition, a distance between every two adjacent second through holes a2 among the plurality of second through holes a2 in the second region 102b2 may be a fixed distance.

Figure 4:
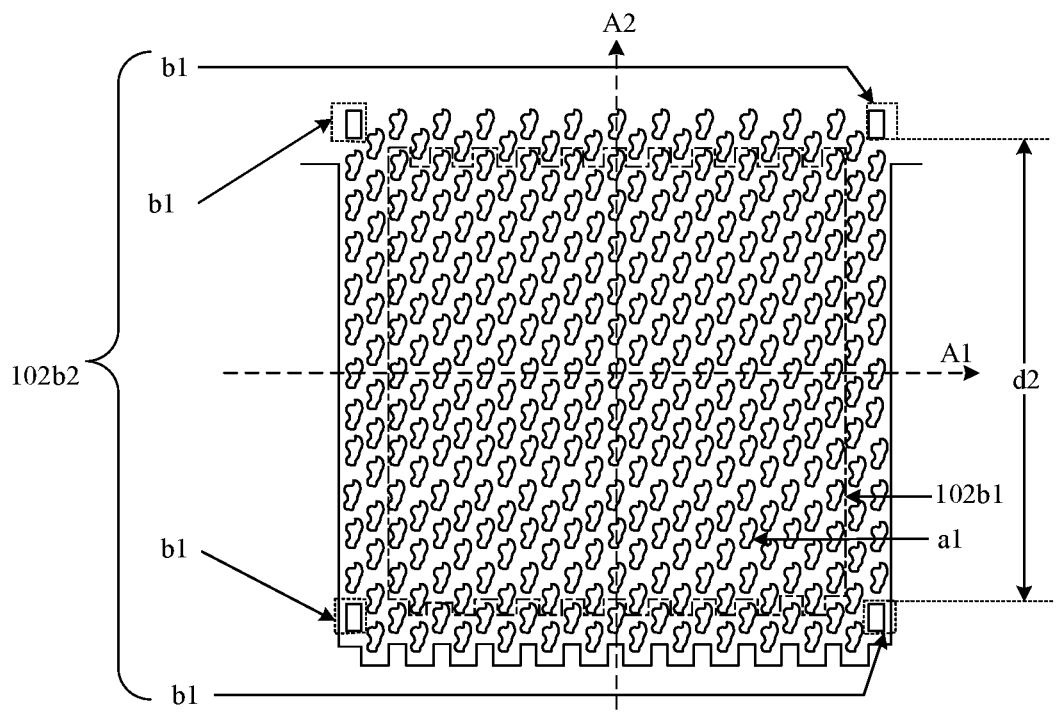
FIG. 4 is a schematic diagram of a second mask region according to another embodiment of the present disclosure.

In an exemplary embodiment, referring to FIG. 3, if the second region 102b2 is an integral region, a distance d1 between every two adjacent second through holes a2 among the plurality of second through holes a2 may be a fixed distance. Referring to FIG. 4, if the second region 102b2 is divided into a plurality of disconnected sub-regions b1 and each sub-region b1 includes at least one second through hole a2, a distance d2 between every two adjacent sub-regions b1 among the plurality of sub-regions b1 may be a fixed distance. If a certain sub-region b1 is provided with a plurality of second through holes a2, a distance between every two adjacent second through holes a2 among the plurality of second through holes a2 in the sub-region b1 may be a fixed distance.

In this embodiment of the present disclosure, since the second region 102b2 is close to the boundary of the second mask region 102b relative to the first region 102b1, the second through holes a2 in the second region 102b2 are proximal to the boundary of the second mask region 102b relative to the first through holes a1 in the first region 102b1.

Of course, since the first region 102b1 is provided with a plurality of first through holes a1, the second through holes a2 being close to the boundary of the second mask region 102b relative to the first through holes a1 may mean that the second through holes a2 are close to the boundary of the second mask region 102b relative to target first through holes. However, the second through holes a2 are close to the center of the second mask region 102b relative to other first through holes except the target first through holes among the plurality of first through holes a1. In addition, the number of the other first through holes is less than the number of the target first through holes.

In general cases, in order to enable a region of the display panel where the camera is disposed to display an image normally, the first cathode pattern manufactured by the first through holes a1 can cover a light-emitting region of sub-pixels. Further, the area of the second through hole a2 may be set to be greater than or equal to the area of each first through hole a1, such that it can be ensured that the second cathode pattern manufactured by the second through holes a2 covers a light-emitting region of sub-pixels while the first cathode pattern covers the light-emitting region of the sub-pixel.

Optionally, a ratio of the area of the second through hole to the area of the first through hole may range from 1 to 3. For example, the ratio of the area of the second through hole to the area of the first through hole is 2. That is, the area of the second through hole a2 may be two times of the area of the first through hole a1.

In order to prevent the transmittance of the display panel from being affected because the second cathode pattern manufactured by the second through holes a2 is too large, in the mask 10 according to the embodiment of the present application, the area of the second through hole a2 is an area of a minimum circumscribed pattern of the first through hole a1 in the case that the shape of the second through hole a2 is a regular shape. Optionally, a ratio of the area of the second through hole to the area of the first through hole may be at least 1.

In an exemplary embodiment, the shape of the second through hole a2 is a rectangle, and the area of the second through hole a2 is equal to an area of a minimum circumscribed rectangle of the first through hole a1.

In this embodiment of the present disclosure, referring to FIG. 2, the shape of the second mask pattern 102b may be a rectangle. In addition, a length of one of two vertical boundaries of the second mask region 102b may range from 2 mm to 10 mm, and a length of the other of the two vertical boundaries of the second mask region 102b may range from 2 mm to 15 mm.

Optionally, at least one boundary of the second mask region 102b adjacent to the first mask region 102a may be saw-shaped. Therefore, when the mask 10 according to the embodiment of the present disclosure is configured to manufacture the display panel, a light-emitting region of a first sub-pixel in the first display region of the display panel may be avoided, such that the first cathode layer of the first display region manufactured by the first mask region 102a can cover a light-emitting region of first sub-pixels in the first display region, thereby ensuring that the first sub-pixels can emit light normally.

In an exemplary embodiment, referring to FIG. 3, a lower boundary of the second mask region 102b may be saw-shaped. Of course, a left boundary and a right boundary of the second mask region may also be of a saw-shaped structure, which is not limited in the embodiments of the present disclosure. Alternatively, the lower boundary, the left boundary, and the right boundary of the second mask region 101b may all be straight lines.

As a first optional embodiment, referring to FIG. 4, the second region 102b2 may include a plurality of sub-regions b1. Each sub-region b1 may be a region proximal to a corner of the second mask region 102b, and include at least one second through hole a2.

If each sub-region b1 is a region proximal to a corner of the second mask region 102b, each sub-region b1 is away from two central axes (A1 and A2) of the second mask region 102b relative to the first region 102b1. An intersection of the two central axes of the second mask region 102b is the center of the second mask region 102b.

In an exemplary embodiment, the shape of the second mask region 102b is a rectangle, such that the second mask region 102b are four corner regions. Therefore, referring to FIG. 4, the second region 102b2 includes four sub-regions b1, each sub-region b1 being a region proximal to one of four corners of the second mask region 102b. Each sub-region b1 includes one second through hole a2. That is, the second region 102b2 include four second through holes a2.

Assuming that the second mask region 102b is divided into four quadrant regions by the two central axes (A1 and A2) of the second mask region 102b, each sub-region b1 is disposed in one quadrant region. That is, each sub-region b1 is not overlapped with any central axis.

In this embodiment of the present disclosure, the center of the first region 102b1 is overlapped with the center of the second mask region 102b.

Figure 5:
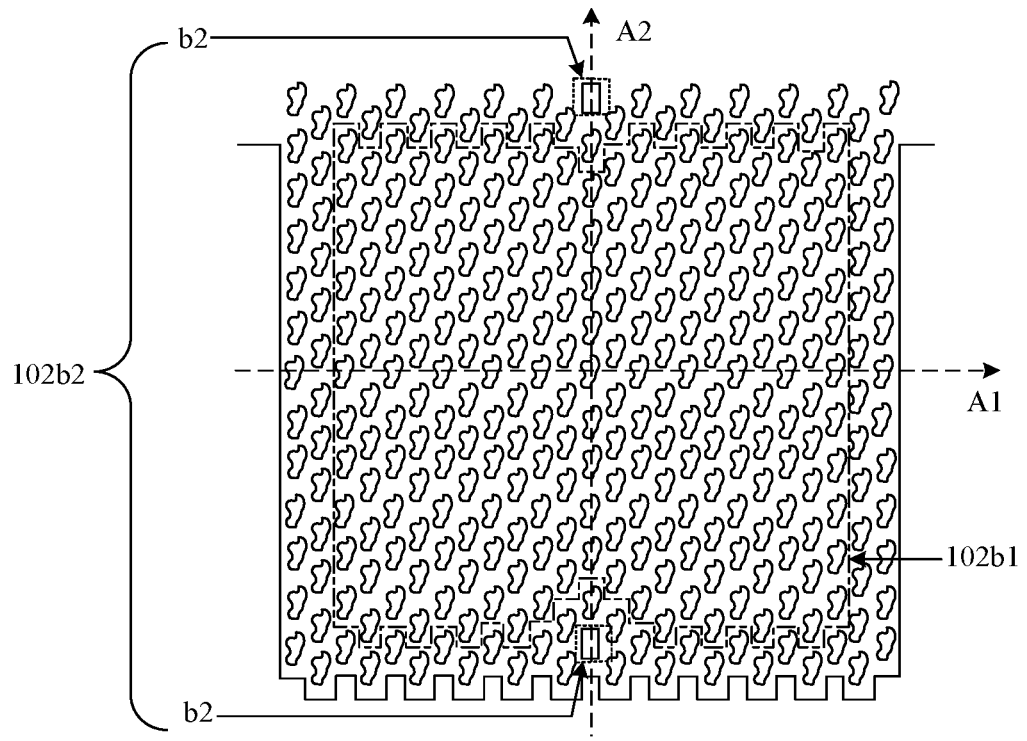
FIG. 5 is a schematic diagram of a second mask region according to yet another embodiment of the present disclosure.

As a second optional embodiment, referring to FIG. 5, the second region 102b2 includes a plurality of sub-regions b2, each sub-region b2 being a region proximal to a midpoint of a boundary of the second mask region 102b and each sub-region b2 being provided with at least one second through hole a2.

If each sub-region b2 is a region proximal to the midpoint of the boundary of the second mask region 102b, each sub-region b2 is overlapped with one of two central axes of the second mask region 102b. Optionally, a center of each sub-region b2 is disposed on one of the two central axes of the second mask region 102b.

In an exemplary embodiment, referring to FIG. 5, the second region 102b2 includes two sub-regions b2, and two sub-regions b2 are regions proximal to a midpoint of an upper boundary and a midpoint of a lower boundary of the second mask region 102b respectively. Alternatively, referring to FIG. 6, the two sub-regions b2 are regions proximal to a midpoint of a left boundary and a midpoint of a right boundary of the second mask region 102b respectively. Alternatively, referring to FIG. 7, the second region 102b2 includes four sub-regions b2, each sub-region b2 being a region proximal to the midpoint of one of four boundaries of the second mask region 102b.

In addition, a center of the upper sub-region b2 and a center of the lower sub-region b2 are both disposed on the central axis A2. A center of the left sub-region b2 and a center of the right sub-region b2 are both disposed on the central axis A1.

Figure 6:
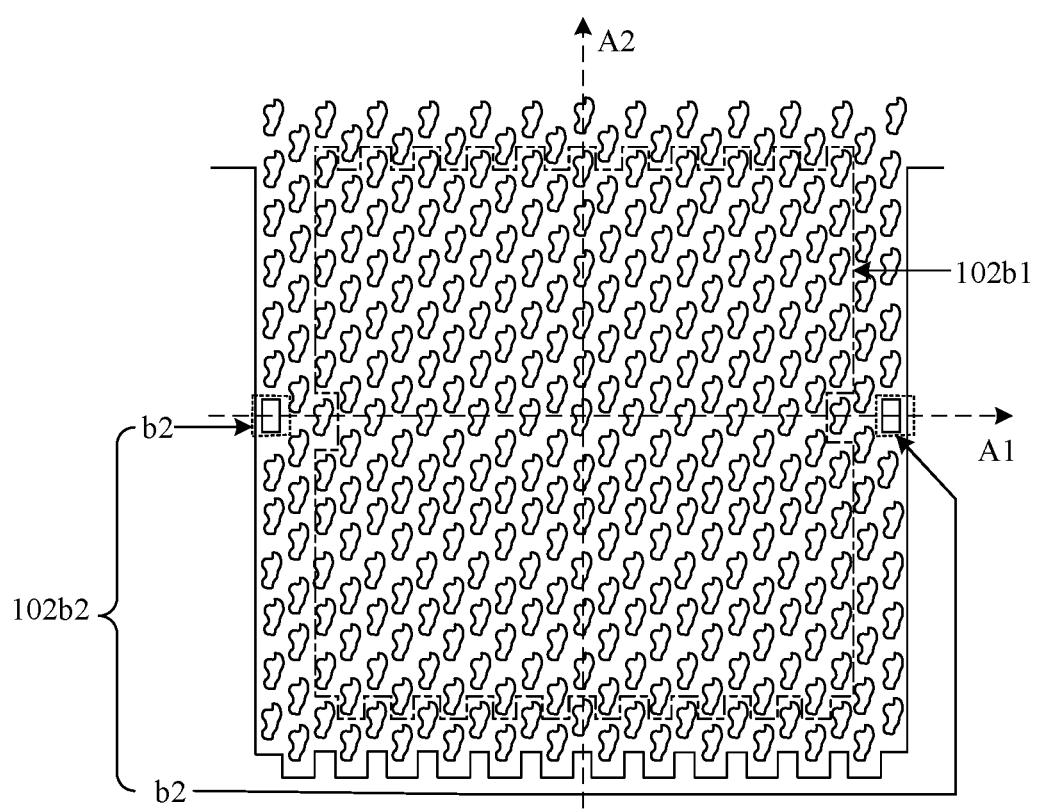
FIG. 6 is a schematic diagram of a second mask region according to yet another embodiment of the present disclosure.
Figure 7:
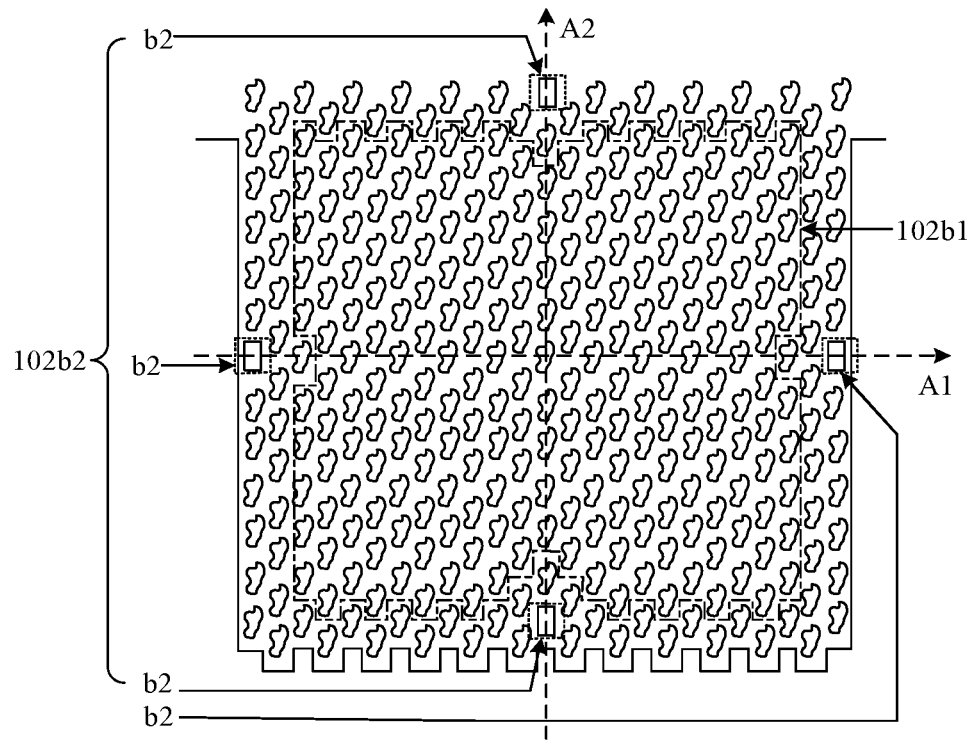
FIG. 7 is a schematic diagram of a second mask region according to yet another embodiment of the present disclosure.

Referring to FIG. 5 to FIG. 7, each sub-region b2 includes one second through hole a2. That is, the second region 102b2 in FIG. 5 and FIG. 6 includes two second through holes a2, and the second region 102b2 in FIG. 7 includes four second through holes a2.

In this embodiment of the present disclosure, the center of the first region 102b1 is overlapped with the center of the second mask region 102b.

Figure 8:
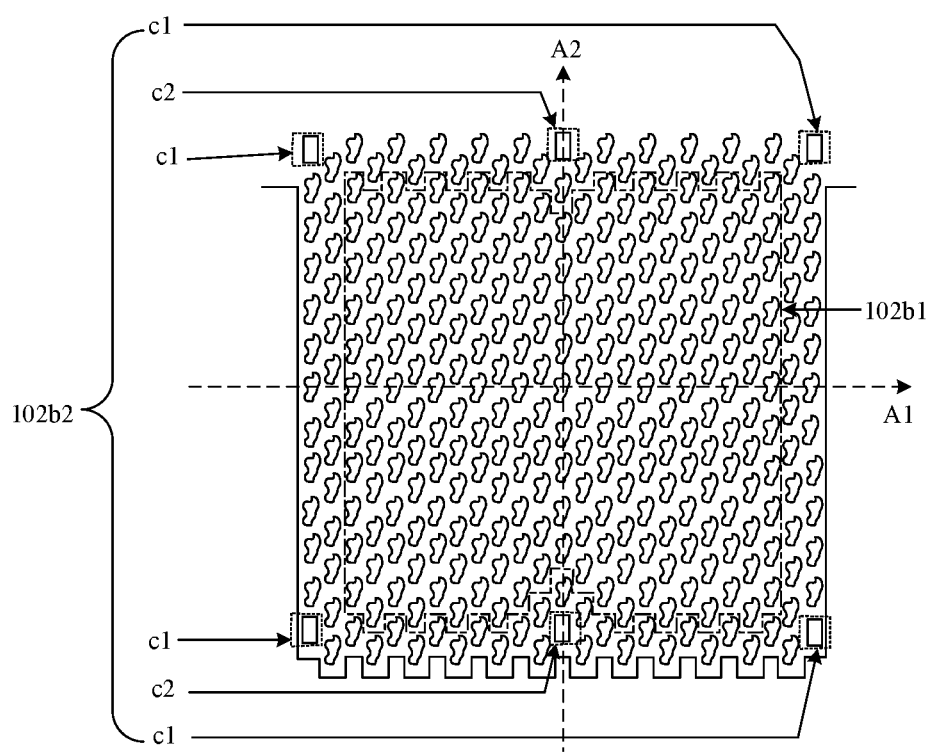
FIG. 8 is a schematic diagram of a second mask region according to yet another embodiment of the present disclosure.

As a third optional embodiment, referring to FIG. 8, the second region 102b2 includes a plurality of first sub-regions c1 and a plurality of sub-regions c2. Each first sub-region c1 is a region proximal to one of the corners of the second mask region 102b, and each second sub-region c2 is a region proximal to the midpoint of the boundary of the second mask region 102b. Each first sub-region c1 includes at least one second through hole a2, and each second sub-region c2 includes at least one second through hole a2.

In this embodiment of the present disclosure, if each first sub-region c1 is a region proximal to one of the corners of the second mask region 102b, each first sub-region c1 is away from two central axes (A1 and A2) of the second mask region 102b relative to the first region 102b1. That is, each first sub-region c1 is not overlapped with any central axis. If each second sub-region c2 is a region proximal to the midpoint of the boundary of the second mask region 102b, each second sub-region c2 is overlapped with one of two central axes of the second mask region 102b.

Assuming that the second mask region 102b is divided into four quadrant regions by the two central axes (A1 and A2) of the second mask region 102b, each sub-region c1 is disposed in one quadrant region. The center of each second sub-region c2 is disposed on one central axis.

In an exemplary embodiment, referring to FIG. 8, the second region 102b2 includes four first sub-regions c1 and two second sub-regions c2. Each of the four first sub-regions c1 is a region proximal to one of four corners of the second mask region 102b. The two sub-regions c2 are regions proximal to the midpoint of the upper boundary and the midpoint of the lower boundary of the second mask region 102b, respectively. Alternatively, referring to FIG. 9, the two second sub-regions c2 are regions proximal to the midpoint of the left boundary and the midpoint of the right boundary of the second mask region 102b, respectively. Alternatively, referring to FIG. 10, the second region 102b2 includes four second sub-regions c2. Each of the four second sub-regions c2 is a region proximal to the midpoint of one of four boundaries of the second mask region 102b.

Figure 9:
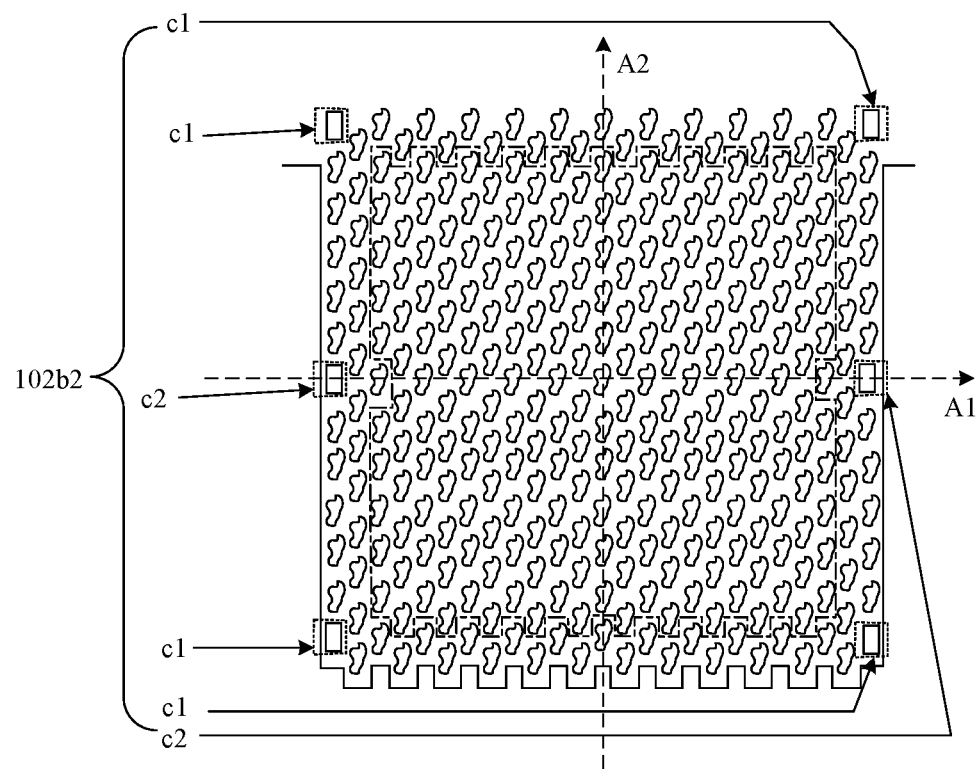
FIG. 9 is a schematic diagram of a second mask region according to yet another embodiment of the present disclosure.
Figure 10:
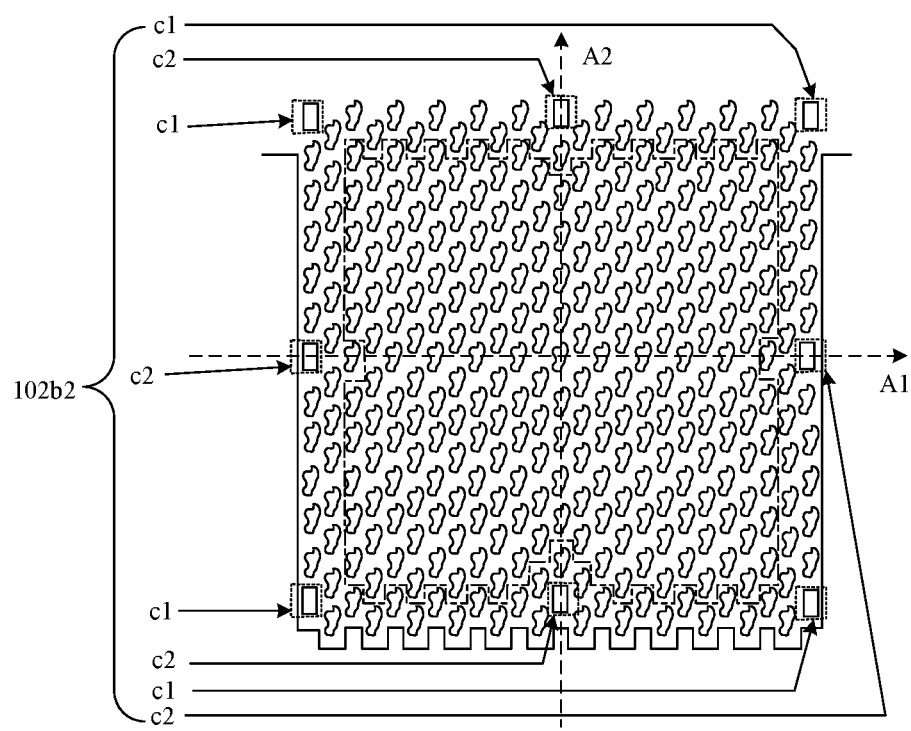
FIG. 10 is a schematic diagram of a second mask region according to yet another embodiment of the present disclosure.

Referring to FIG. 8 to FIG. 10, each first sub-region c1 is provided with one second through hole a2. Each second sub-region c2 is provided with one second through hole a2. That is, the second region 102b2 in FIG. 8 and FIG. 9 includes six second through holes a2, and the second region 102b2 in FIG. 10 includes eight second through holes a2.

In this embodiment of the present disclosure, the center of the first region 102b1 is overlapped with the center of the second mask region 102b.

As a fourth optional embodiment, the second region 102b2 is a strip-shaped region extending along a row direction X1 and/or a column direction X2. Referring to FIG. 3, the second region 102b2 is a strip-shaped region extending along the row direction X. The row direction X1 may be parallel with an upper boundary s1 of the second mask region 102b, and the column direction X2 may be parallel with a left boundary s2 of the second mask region 102b.

Referring to FIG. 3, the second region 102b2 is a strip-shaped region extending along the row direction X1. The plurality of second through holes a2 are arranged in the row direction X1. Alternatively, the second region 102b2 is a strip-shaped region extending along the column direction X2. The plurality of second through holes a2 are arranged in the column direction X2.

In this embodiment of the present disclosure, the second mask region 102b may further include a lower boundary s3 and a right boundary s4. The lower boundary s3 is parallel with the upper boundary s1, and the right boundary s4 is parallel with the left boundary s2. The upper boundary s1 of the second mask region 102b is a boundary, which is not adjacent to the first mask region 102a, in the second mask region 102b.

If the second region 102b2 is a strip-shaped region extending along the row direction X1, referring to FIG. 3, the second region 102b2 is close to the upper boundary s1 of the second mask region 102b relative to the first region 102b1. Alternatively, the second region 102b2 is close to the lower boundary s3 of the second mask region 102b than the first region 102b1.

If the second region 102b2 is a strip-shaped region extending along the column direction X2, the second region 102b2 is close to the left boundary s2 of the second mask region 102b relative to the first region 102b1. Alternatively, the second region 102b2 is close to the right boundary s4 of the second mask region 102b relative to the first region 102b1.

In this embodiment of the present disclosure, if the second region 102b2 is a strip-shaped region extending along the row direction X1, the plurality of second through holes a2 are arranged in a row. If the second region 102b2 is a strip-shaped region extending along the column direction X2, the plurality of second through holes a2 are arranged in a column.

Figure 11:
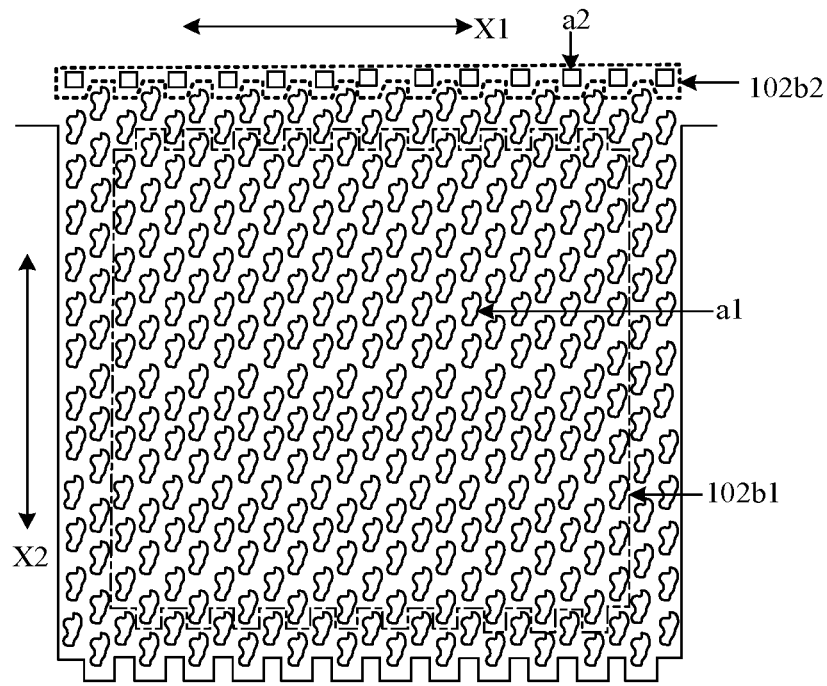
FIG. 11 is a schematic diagram of a second mask region according to yet another embodiment of the present disclosure.

In this embodiment of the present disclosure, the upper boundary s1 is close to the boundary of the mask body 102 relative to the left boundary s2, the lower boundary s3, and the right boundary s4. In addition, sub-pixels proximal to the boundary in the display panel may not need to display an image. Therefore, if the second region 102b2 is a strip-shaped region extending along the row direction X1 and the second region 102b2 is close to the upper boundary s1 of the second mask region 102b relative to the first region 102b1, the cathode pattern manufactured by the second through holes a2 may not need to cover a light-emitting region of the sub-pixels. Referring to FIG. 11, the area of each second through hole a2 in the second region 102b2 may be small.

Figure 12:
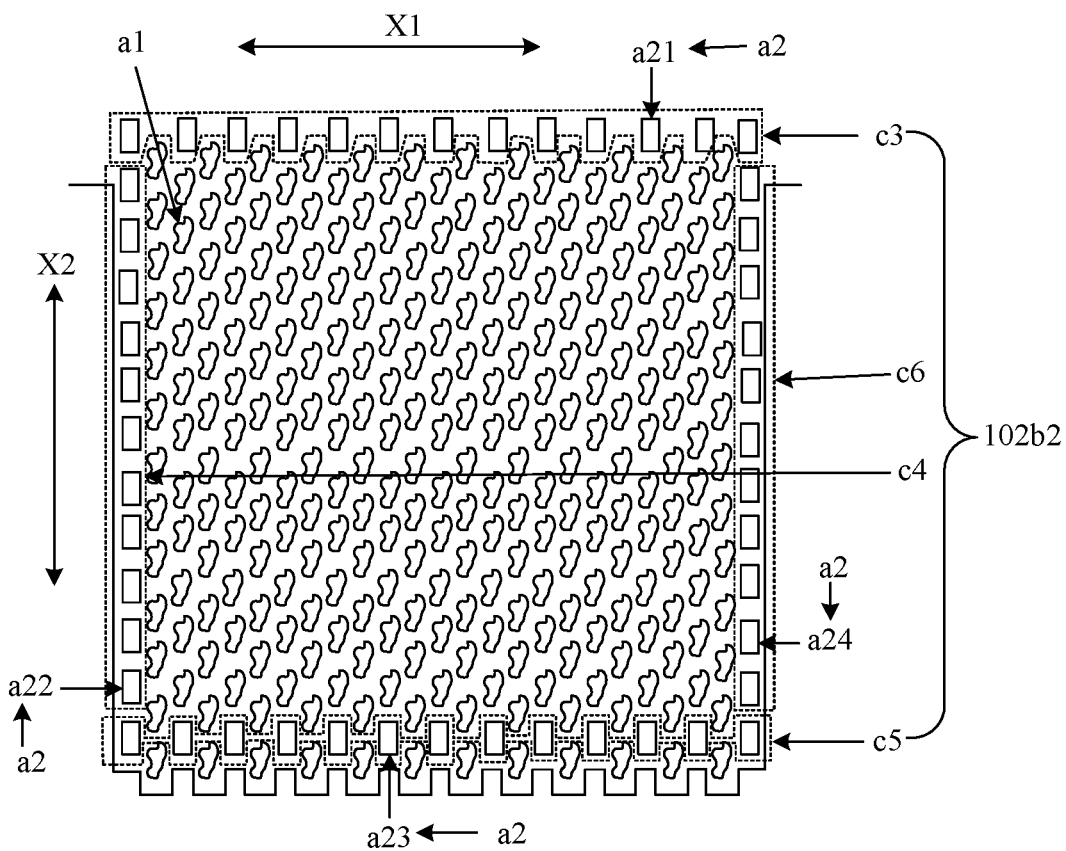
FIG. 12 is a schematic diagram of a second mask region according to yet another embodiment of the present disclosure.

As a fifth optional embodiment, the second region 102b2 is a strip-shaped region extending along the row direction X1 and/or the column direction X2. Referring to FIG. 12, the second region 102b includes a third strip-shaped sub-region c3 extending along the row direction X1, a fourth strip-shaped sub-region c4 extending along the column direction X2, a fifth strip-shaped sub-region c5 extending along the row direction X1, and a sixth strip-shaped sub-region c6 extending along the column direction X2. In addition, the third sub-region c3, the fourth sub-region c4, the fifth sub-region 5, and the sixth sub-region c6 may be connected to form an annular strip-shaped region.

The row direction X1 is parallel with the upper boundary s1 of the second mask region 102b, and the column direction X2 is parallel with the left boundary s2 of the second mask region 102b.

In this embodiment of the present disclosure, the second mask region 102b may further include a lower boundary s3 and a right boundary s4. The lower boundary s3 is parallel to the upper boundary s1, and the right boundary s4 is parallel to the left boundary s2. The upper boundary s1 of the second mask region 102b is a boundary, which is not adjacent to the first mask region 102a, in the second mask region 102b.

Referring to FIG. 12, the plurality of second through holes a2 includes a plurality of first-type second through holes a21 disposed in the third sub-region c3 and arranged along the row direction X1, a plurality of second-type second through holes a22 disposed in the fourth sub-region c4 and arranged along the column X2 direction, a plurality of third-type second through holes a23 disposed in the fifth sub-region c5 and arranged along the row direction X1, and a plurality of fourth-type second through holes a24 disposed in the sixth sub-region c6 and arranged along the column direction X2.

In this embodiment of the present disclosure, the third sub-region c3 is close to the upper boundary s1 of the second mask region 102b relative to the first region 102b1; the fourth sub-region c4 is close to the left boundary s2 of the second mask region 102b relative to the first region 102b1; the fifth sub-region c5 is close to the lower boundary s3 of the second mask region 102b relative to the first region 102b1; and the sixth sub-region c6 is close to the right boundary s4 of the second mask region 102b relative to the first region 102b1.

Referring to FIG. 12, the plurality of first-type second through holes a21 disposed in the third sub-region c3 is close to the upper boundary s1 relative to the plurality of first through holes a1. The plurality of second-type second through holes a22 disposed in the fourth sub-region c4 is close to the left boundary s2 relative to the plurality of first through holes a1. The plurality of third-type second through holes a23 disposed in the fifth sub-region c5 is close to the lower boundary s3 relative to the plurality of first through holes a1. The plurality of fourth-type second through holes a24 disposed in the sixth sub-region c6 is close to the right boundary s4 relative to the plurality of first through holes a1.

In this embodiment of the present disclosure, referring to FIG. 12, the plurality of first-type second through holes a21 are arranged in a row; the plurality of second-type second through holes a22 are arranged in a column; the plurality of third-type second through holes a23 are arranged in a row; and the plurality of fourth-type through holes a24 are arranged in a column.

The upper boundary s1 is close to the boundary of the mask body 102 relative to the left boundary s2, the lower boundary s3, and the right boundary s4. In addition, since sub-pixels proximal to the boundary in the display panel may not need to display an image, the cathode pattern manufactured by the first-type second through holes a21 may not need to cover a light-emitting region of the sub-pixels. The area of each first-type second through hole a21 in the third region c3 may be small.

In this embodiment of the present disclosure, the second region 102b2 may also include other number of strip-shaped regions. The number of the strip-shaped regions is not limited in the embodiments of the present disclosure. Each strip-shaped region includes at least two adjacent second through holes a2.

In addition, the area of the strip-shaped region may be positively correlated with the number of second through holes a2 in the strip-shaped region. That is, the greater the number of second through holes a2 in the strip-shaped region is, the larger the area of the strip-shaped region is; and the less the number of second through holes a2 in the strip-shaped region is, the smaller the area of the strip-shaped region is. The area of the strip-shaped region is not limited in the embodiments of the present disclosure.

Figure 13:
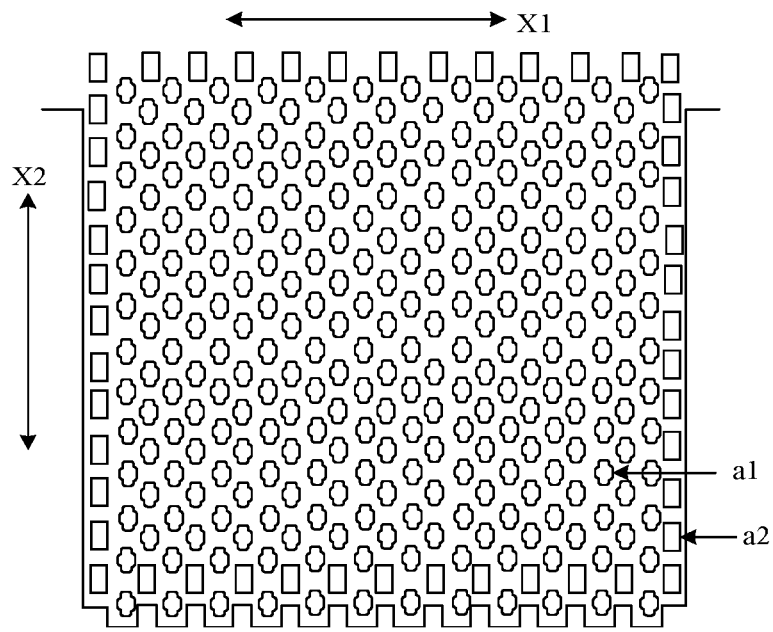
FIG. 13 is a schematic diagram of a second mask region according to yet another embodiment of the present disclosure.

It should be noted that the shape of each first through hole a1 in the first region 102b1 of the mask 10 according to the embodiment of the present application is not limited to the shape shown in FIGS. 3 to 12. Referring to FIG. 13, each first through hole a1 may be in other shape, which is not limited in the embodiments of the present disclosure. The shape of the first through hole a1 may be determined based on an arrangement fashion of the light-emitting regions of the sub-pixels in the display panel.

In summary, the embodiment of the present disclosure provides a mask, gaps are formed among first through holes in a first region of the mask and among second through holes in a second region of the mask. Therefore, there are gaps among a plurality of cathode patterns in the display panel manufactured by using the mask, such that a transmittance of the display panel is higher, and an imaging effect of a camera is better. In addition, since the shape of the second through hole is a centrally symmetric pattern or an axially symmetric pattern, the net tensioning device can acquire position informational of the second through hole, and can fix a mask body on a mask frame based on the positional information of the second through hole, so as to ensure the net tensioning accuracy of the net tensioning device, thereby ensuring a yield of the display panel manufactured by using the mask.

Figure 14:
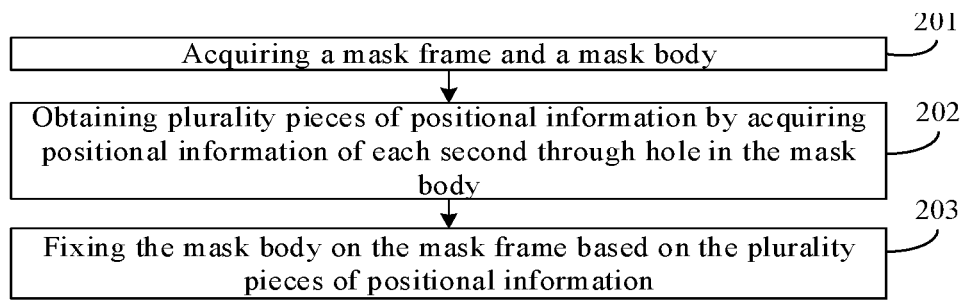
FIG. 14 is a flowchart of a method for manufacturing a mask according to an embodiment of the present disclosure.

FIG. 14 is a flowchart of a method for manufacturing a mask according to an embodiment of the present disclosure. This method is applicable to a net tensioning device and configured to manufacture the mask 10 according to the above-mentioned embodiment. Referring to FIG. 14, the method includes the following steps.

In step 201, a mask frame and a mask body are acquired.

In this embodiment of the present disclosure, the net tensioning device may acquire the mask frame 101 and the mask body 102 first. Referring to FIG. 2, the mask body 102 includes a first mask region 102a and a second mask region 102b. The second mask region 102b includes a first region 102b1 and a second region 102b2.

An area of the second region 102b2 is smaller than an area of the first region 102b1, and the second region 102b2 is disposed away from a center of the second mask region 102a relative to the first region 102b1. The first region 102b1 is provided with a plurality of first through holes a1; and the second region 102b2 is provided with a plurality of second through holes a2. The first through holes a1 and the second through holes a2 are arranged along a row direction X1 and a column direction X2.

Each first through hole a1 in the first region 102b1 is provided with a first nearest though hole at each side in the row direction X1 and is provided with a second nearest through hole at each side in the column direction X2; and both the first nearest though hole and the second nearest through hole are first through holes a1.

In this embodiment of the present disclosure, a first overlapping length is formed between the first through hole a1 in the first region 102b1 and the first nearest through hole in the column direction X2, the first overlapping length is greater than 70% of the length of the first through hole a1 in the column direction X2. In addition, a second overlapping length is formed between the first through hole a1 in the first region 102b1 and the second nearest through hole in the row direction X1, the second overlapping length is greater than 70% of the length of the first through hole a1 in the row direction X1.

The shape of the first through hole a1 is a first shape, the shape of the second through hole a2 is a second shape, and the second shape is a centrally symmetric pattern or an axially symmetric pattern, i.e., a regular pattern. The first shape may be an irregular shape. In addition, a ratio of the number of the second through holes a2 to the number of the first through holes a1 is less than or equal to 35%. The first through holes a1 and the second through holes a2 are configured to manufacture at least one film layer of sub-pixels in the display panel.

In step 202, plurality pieces of positional information are obtained by acquiring positional information of each second through hole in the mask body.

In this embodiment of the present disclosure, it is generally difficult for the net tensioning device to acquire the positional information of the first through holes a1 of the first shape. However, the net tensioning device may acquire the positional information of the second through holes a2 of the second shape, such that the mask body 102 may be tensioned onto the mask frame 101 by using the net tensioning device based on the positional information of the second through holes a2 of the second shape.

Therefore, the net tensioning device may first acquire the positional information of each second through hole a2 in the mask body 102 before tensioning the mask body 102 onto the mask frame 101. That is, the net tensioning device may acquire plurality pieces of positional information, and the number of the acquired positional information may be the same as the number of the second through holes a2 in the second region 102b2.

In step 203, the mask body is fixed on the mask frame based on the plurality pieces of positional information.

In this embodiment of the present disclosure, the net tensioning device may tension the mask body 102 onto the mask frame 101 based on the plurality pieces of positional information acquired in the step 202. That is, the net tensioning device fixes the mask body 102 on the mask frame 101. For example, the net tensioning device fixes the mask body 102 on the mask frame 101 in a welding fashion.

In summary, according to a method for manufacturing a mask provided by the embodiment of the present disclosure, since the shape of the second through hole in the mask body is a centrally symmetric pattern or an axially symmetric pattern, the net tensioning device can acquire the positional information of the second through hole, and further fix the mask body on the mask frame based on the positional information of the second through hole, so as to ensure the net tensioning accuracy of the net tensioning device, thereby ensuring a yield of the display panel manufactured by using the mask.

Figure 15:
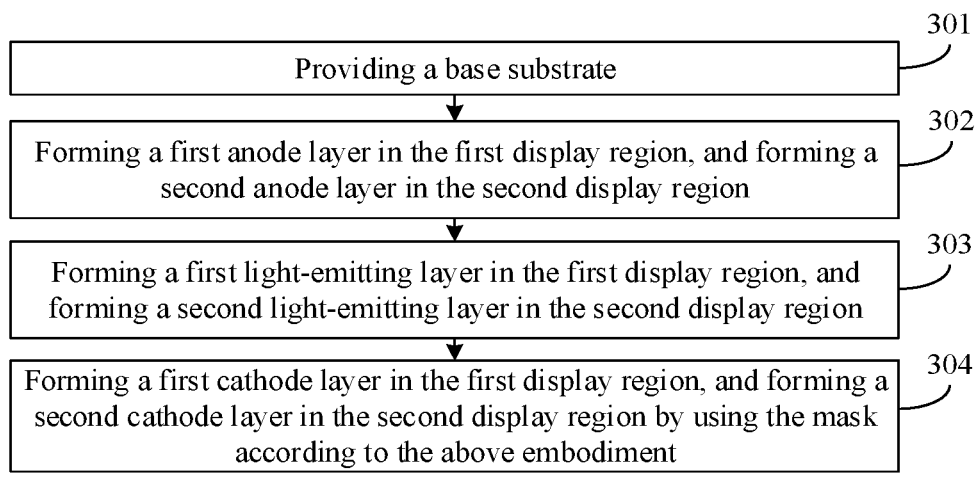
FIG. 15 is a flowchart of a method for manufacturing a display panel according to an embodiment of the present disclosure.

FIG. 15 is a flowchart of a method for manufacturing a display panel according to an embodiment of the present disclosure. Referring to FIG. 15, the method includes the following steps.

In step 301, a base substrate is provided.

The base substrate includes a first display region and a second display region disposed at the side of the first display region. The base substrate may be a glass substrate.

In step 302, a first anode layer is formed in the first display region, and a second anode layer is formed in the second display region.

In this embodiment of the present disclosure, the first anode layer and the second anode layer may be formed by one patterning process. In addition, a material of the first anode layer may be the same as a material of the second anode layer. Optionally, the material for making the first anode layer and the second anode layer includes: indium tin oxide (ITO) and silver (Ag).

In step 303, a first light-emitting layer is formed in the first display region, and a second light-emitting layer is formed in the second display region.

In this embodiment of the present disclosure, the first light-emitting layer and the second light-emitting layer may be formed by one patterning process. In addition, a material of the first light-emitting layer may be the same as a material of the second light-emitting layer.

Each of the first light-emitting layer and the second light-emitting layer includes a plurality of light-emitting layer patterns arranged at intervals. The first light-emitting layer and the second light-emitting layer may be manufactured by using a fine metal mask (FMM).

In step 304, a first cathode layer is formed in the first display region, and a second cathode layer is formed in the second display region by using the mask provided by the above embodiments.

In this embodiment of the present disclosure, the first cathode layer may be formed by the first mask region 102a in the mask 10. The second cathode layer may include a plurality of first cathode patterns and a plurality of second cathode patterns, which are arranged at intervals. The first cathode pattern may be formed by the first through holes a1 in the mask, and the second cathode pattern may be formed by the second through holes a2 in the mask.

In addition, when the first cathode layer is formed in the first display region, a plurality of first cathode patterns and a plurality of second cathode patterns of the second cathode layer may be simultaneously formed in the second display region. That is, the plurality of first cathode patterns and the plurality of second cathode patterns of the first cathode layer and the second cathode layer can be manufactured by the same patterning process.

Since the second region 102b2 in the mask is away from a center of the second mask region 102b relative to the first region 102b1, the second through holes a2 in the second region 102b2 are away from the center of the second mask region 102b relative to the first through holes a1 in the first region 102b1. Therefore, the second cathode pattern manufactured by the second through holes a2 is away from the center of the second display region relative to the first cathode pattern manufactured by the first through holes a1.

In addition, since the shape of each first through hole a1 in the first region 102b1 is the first shape (irregular shape), the shape of the manufactured first cathode pattern may also be the first shape. In addition, since the shape of each second through hole a2 in the second region 102b2 is the second shape (centrally symmetric pattern or axially symmetric pattern), the shape of the manufactured second cathode pattern may also be the second shape.

Since a region proximal to the center of the second display region is usually provided with a camera, a transmittance of the display panel may be ensured to a greater extent by manufacturing the shape of the first cathode pattern proximal to the center of the second display region as an irregular shape.

In summary, according to the method for manufacturing a display panel provided by the embodiment of the present disclosure, gaps are formed among the plurality of first cathode patterns and the plurality of second cathode patterns in the second cathode layer in the manufactured display panel, such that the transmittance of the display panel is higher, and an imaging effect of the camera is better.

Figure 16:
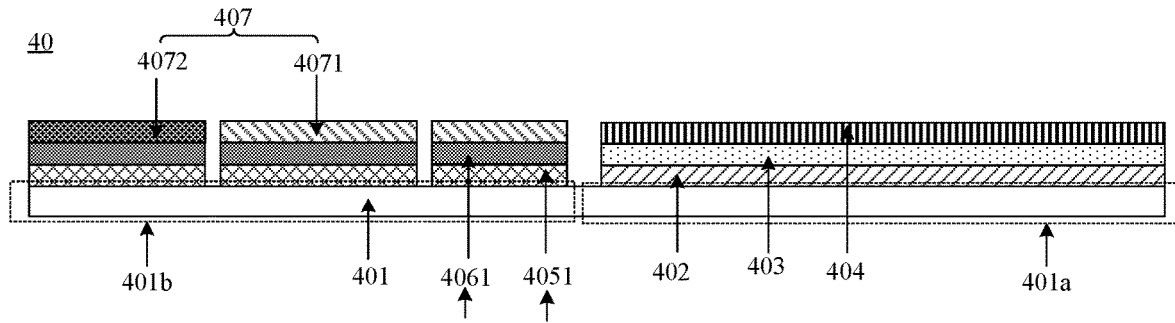
FIG. 16 is a schematic structural diagram of a display panel according to an embodiment of the present disclosure.

FIG. 16 is a schematic structural diagram of a display panel according to an embodiment of the present disclosure. The display panel may be manufactured by using the method provided by the above embodiments. Referring to FIG. 16, the display panel 40 includes a base substrate 401, a first anode layer 402, a first light-emitting layer 403, a first cathode layer 404, a second anode layer 405, a second light-emitting layer 406, and a second cathode layer 407.

The base substrate 401 includes a first display region 401a and a second display region 401b disposed at the side of the first display region 401a. The first anode layer 402, the second light-emitting layer 406, and the first cathode layer 404 are disposed in the first display region 401a and are sequentially laminated in a direction away from the base substrate 401. The first anode layer 405, the second light-emitting layer 406, and the second cathode layer 407 may be disposed in the second display region 401b, and are sequentially laminated in a direction away from the base substrate 401.

The first cathode layer 404 may be formed by the first mask region 102a in the mask 10 according to the above embodiment. The first cathode layer 404 may be of a platy structure.

Figure 17:
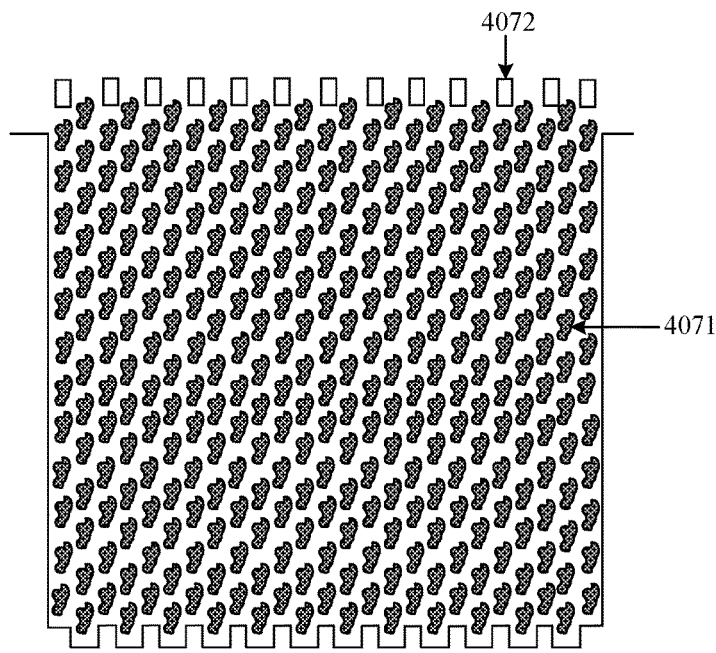
FIG. 17 is a schematic partial structure diagram of a display panel according to an embodiment of the present disclosure.

FIG. 17 is a schematic local structural diagram of a display panel according to an embodiment of the present disclosure. In conjunction with FIG. 16 and FIG. 17, the second cathode layer 407 includes a plurality of first cathode patterns 4071 and a plurality of second cathode patterns 4072, which are arranged at intervals. The first cathode pattern 4071 is formed by the first through holes a1 in the mask 10, and the second cathode pattern 4072 is formed by the second through holes a2 in the mask 10.

Since the second region 102b2 in the mask 10 is away from a center of the second mask region 102b relative to the first region 102b1, the second through holes a2 in the second region 102b2 are away from the center of the second mask region 102b relative to the first through holes a1 in the first region 102b1. Therefore, in the display panel 40 according to the embodiment of the present application, the second cathode pattern 4072 may be away from the center of the second display region 401b relative to the first cathode pattern 4071.

In addition, since the shape of each first through hole a1 in the first region 102b1 of the mask 10 is a first shape (irregular shape), the shape of the manufactured first cathode pattern 4071 may also be the first shape. Since the shape of each second through hole a2 in the second region 102b2 of the mask is a second shape (centrally symmetric pattern or axially symmetric pattern, i.e., a regular shape), the shape of the manufactured second cathode pattern 4072 may also be the second shape.

Since a region proximal to the center of the second display region 401b is usually provided with a camera, a transmittance of the display panel may be ensured to a greater extent by designing the shape of the first cathode pattern 4071 proximal to the center of the second display region 401b as an irregular shape, thereby ensuring an imaging effect of the camera. In addition, since the shape of the second cathode pattern 4072 is a regular shape, and the distance between the second cathode pattern 4072 and the center of the second display region 401b is relatively large, the imaging effect of the camera will not be greatly affected.

In summary, according to the display panel provided by the embodiment of the present disclosure, gaps are formed among the plurality of first cathode patterns and the plurality of second cathode patterns in the second cathode layer of the display panel, such that the transmittance of the display panel is higher, and an imaging effect of the camera is better.

In this embodiment of the present disclosure, the first anode layer 402, the first light-emitting layer 403, and the first cathode layer 404 may be divided into a plurality of first sub-pixels. The second anode layer 405, the second light-emitting layer 406, and the second cathode layer 407 may be divided into a plurality of second sub-pixels. An orthogonal projection of each first cathode pattern 4071 on the base substrate 401 may cover an orthogonal projection of a light-emitting region of one or more second sub-pixels on the base substrate 401. An orthogonal projection of each second cathode pattern 4072 on the base substrate 401 may cover an orthogonal projection of a light-emitting region of one or more second sub-pixels on the base substrate 401.

As can be seen from FIG. 16, the second anode layer 405 includes a plurality of anode patterns 4051. The second light-emitting layer 406 includes a plurality of light-emitting layer patterns 4061. In addition, the plurality of anode patterns 4051, the plurality of light-emitting layer patterns 4061, and the plurality of cathode patterns (including the plurality of first cathode patterns 4071 and the plurality of second cathode patterns 4072) may be disposed in a one-to-one correspondence fashion. Each anode pattern 4051, a corresponding light-emitting layer pattern 4061 and a corresponding cathode pattern (the first cathode pattern 4071 or the second cathode pattern 4072) may constitute one second sub-pixel.

Of course, the first anode layer 402 may include a plurality of anode patterns (not shown). The first light-emitting layer 403 may include a plurality of light-emitting layer patterns (not shown). The plurality of anode patterns is in one-to-one correspondence to the plurality of light-emitting layer patterns. Each anode pattern, a corresponding light-emitting layer pattern and the first cathode layer 404 constitutes one first sub-pixel.

In this embodiment of the present disclosure, the plurality of second sub-pixels can be divided into a plurality of sub-pixel groups. Each sub-pixel group includes a plurality of second sub-pixels; and light-emitting regions of the plurality of second sub-pixels in each sub-pixel group are arranged in 3 rows*3 columns.

The arrangement of the light-emitting regions of the second sub-pixels in the sub-pixel group in 3 rows*3 columns means that at least some of positions among the 9 positions in 3 rows*3 columns have light-emitting regions of the second sub-pixels. In an exemplary embodiment, each sub-pixel group includes one first-color second sub-pixel, two second-color second sub-pixels and one third-color second sub-pixel. That is, each sub-pixel group includes four second sub-pixels; and the light-emitting region of each of the four second sub-pixels is disposed in any of the 9 positions in 3 rows*3 columns.

Optionally, the first color is red (R), the second color is green (G), and the third color is blue (B).

Figure 18:
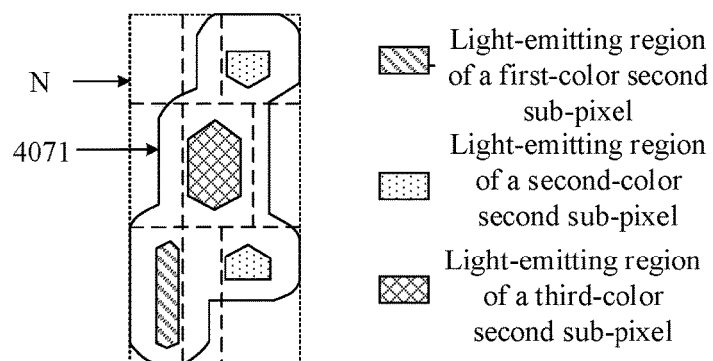
FIG. 18 is a schematic diagram of a first cathode pattern and a light-emitting region of a second sub-pixel according to an embodiment of the present disclosure.

FIG. 18 is a schematic diagram of a first cathode pattern and a light-emitting region of a second sub-pixel according to an embodiment of the present disclosure. Referring to FIG. 18, an orthogonal projection of the first cathode pattern 4071 on the base substrate 401 covers an orthogonal projection of one sub-pixel group on the base substrate 401. That is, the orthographic projection of the first cathode pattern 4071 on the base substrate 401 covers an orthographic projection of the light-emitting region of one first-color second sub-pixel on the base substrate 401, covers orthographic projections of the light-emitting regions of two second-color second sub-pixels on the base substrate 401, and covers an orthographic projection of the light-emitting region of one third-color second sub-pixel on the base substrate 401.

The shape of the first cathode pattern 4071 may be a first shape (irregular shape), and the first shape may be formed by connecting a plurality of straight line segments and a plurality of arc line segments end to end. In addition, an extending direction of at least one straight line segment may be parallel with an extending direction of a boundary of a light-emitting region of at least one second sub-pixel in each sub-pixel group.

As can be seen from FIG. 18, for each sub-pixel group, the light-emitting region of the first-color second sub-pixel may be disposed in a third row and a first column; the light-emitting region of one of the second-color second sub-pixels is disposed in a first row and a third column, and the light-emitting region of the other one of the two second-color second sub-pixels is disposed in the third row and the third column; and the light-emitting region of the third-color second sub-pixel is disposed in a second row and a second column.

Figure 19:
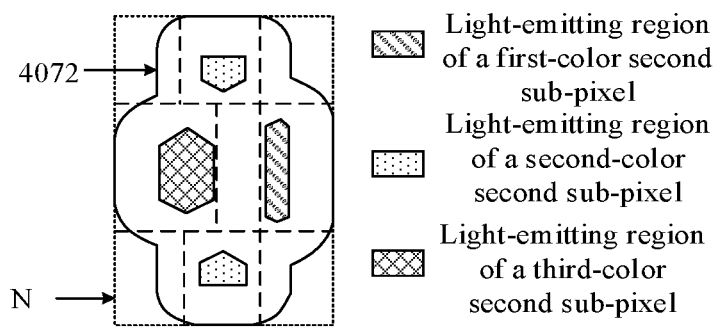
FIG. 19 is a schematic diagram of a first cathode pattern and a light-emitting region of a second sub-pixel according to another embodiment of the present disclosure.

Referring to FIG. 19, for each sub-pixel group, the light-emitting region of the first-color second sub-pixel is disposed in a second row and a third column; the light-emitting region of one of the two second-color second sub-pixels is disposed in a first row and a second column, and the light-emitting region of the other one of the two second-color second sub-pixels is disposed in the third row and the second column; and the light-emitting region of the third-color second sub-pixel is disposed in the second row and the first column.

Of course, each second sub-pixel in each sub-pixel group may also be arranged in other fashions, which is not limited in the embodiments of the present disclosure.

In this embodiment of the present disclosure, a number of the light-emitting regions of the second sub-pixels covered by the first cathode pattern 4071 may be the same as a number of the light-emitting regions of the second sub-pixels covered by the second cathode pattern 4072.

Figure 20:
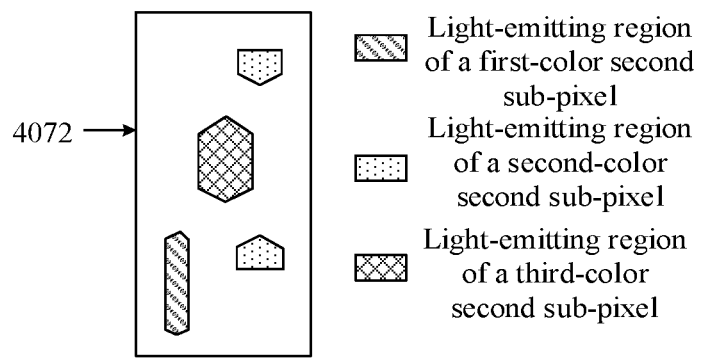
FIG. 20 is a schematic diagram of a second cathode pattern and a light-emitting region of a second sub-pixel according to an embodiment of the present disclosure.

In an exemplary embodiment, referring to FIG. 18 and FIG. 19, an orthogonal projection of the first cathode pattern 4071 on the base substrate 401 covers orthogonal projections of light-emitting regions of four second sub-pixels on the base substrate 401. FIG. 20 is a schematic diagram of a second cathode pattern and a light-emitting region of a second sub-pixel according to an embodiment of the present disclosure. Referring to FIG. 20, an orthographic projection of the second cathode pattern 4072 on the base substrate 401 covers an orthographic projection of the light-emitting region of one first-color second sub-pixel on the base substrate 401, covers orthographic projections of the light-emitting regions of two second-color second sub-pixels on the base substrate 401, and covers an orthographic projection of the light-emitting region of one third-color second sub-pixel on the base substrate 401. That is, the orthographic projection of the second cathode pattern 4072 on the base substrate 401 covers an orthographic projection of the light-emitting regions of the four second sub-pixels on the base substrate 401.

Of course, a number of the light-emitting regions of the second sub-pixels covered by the first cathode pattern 4071 may also be different from a number of the light-emitting regions of the second sub-pixels covered by the second cathode pattern 4072, which is not limited in the embodiments of the present disclosure.

In this embodiment of the present disclosure, the second cathode layer 407 may further include a plurality of third cathode patterns (not shown) disposed at intervals. A number of light-emitting regions of second sub-pixels covered by the third cathode pattern may be less than a number of the light-emitting regions of the second sub-pixels covered by the first cathode pattern 4071. In addition, the number of the light-emitting regions of the second sub-pixels covered by the third cathode pattern may be less than the number of the light-emitting regions of the second sub-pixels covered by the second cathode pattern 4072.

For example, an orthogonal projection of the third cathode pattern on the base substrate 401 is not overlapped with an orthogonal projection of the light-emitting region of any of the second sub-pixels on the base substrate 401. The third cathode pattern cannot form a sub-pixel with a light-emitting layer pattern and an anode pattern, and a region where the third cathode pattern is disposed in the display panel cannot emit light.

In this embodiment of the present disclosure, since the first cathode pattern 4071 is manufactured by the first through holes a1, the shape of the first cathode pattern 4071 is the same as the shape of each first through hole a1, and the area of the first cathode pattern 4071 is the same as that of the first through hole a1. Correspondingly, since the second cathode pattern 4072 is manufactured by the second through holes a2, the shape of the second cathode pattern 4072 is the same as the shape of each second through hole a2, and the area of the second cathode pattern 4072 is the same as that of the second through hole a2.

Figure 21:
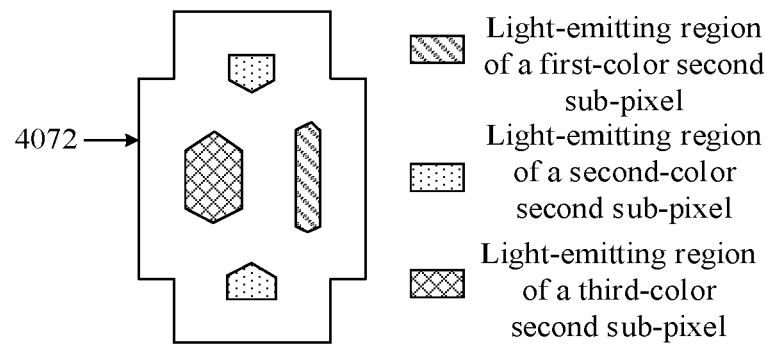
FIG. 21 is a schematic diagram of a second cathode pattern and a light-emitting region of a second sub-pixel according to another embodiment of the present disclosure.
Figure 22:
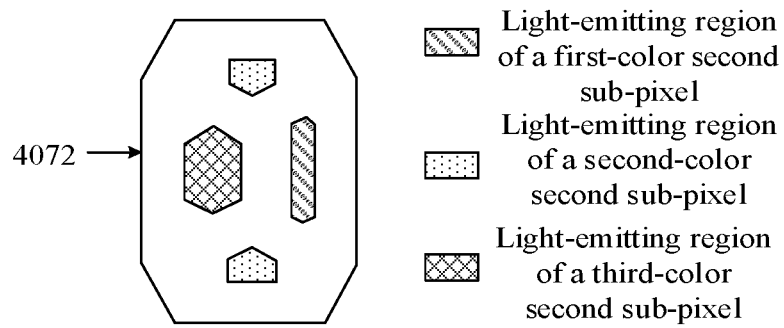
FIG. 22 is a schematic diagram of a second cathode pattern and a light-emitting region of a second sub-pixel according to yet another embodiment of the present disclosure.

In an exemplary embodiment, it is assumed that the shape of the second through hole a2 is a rectangle, referring to FIG. 20, the shape of the second cathode pattern 4072 is also a rectangle. It is assumed that the shape of the second through hole a2 is a cross, referring to FIG. 21, the shape of the second cathode pattern 4072 is also a cross. It is assumed that the shape of the second through hole a2 is an octagon, referring to FIG. 22, the shape of the second cathode pattern 4072 is also an octagon.

Since the area of the second through hole a2 in the mask 10 is larger than or equal to the area of the first through hole a1, the area of the second cathode pattern 4072 is larger than or equal to the area of the first cathode pattern 4071. Therefore, it may also be ensured that the second cathode pattern 4072 can cover the light-emitting region of the second sub-pixel in the case of ensuring that the first cathode pattern 4071 covers the light-emitting region of the second sub-pixel.

In order to prevent the second cathode pattern 4072 from being too large and affecting the transmittance of the display panel 40, the area of the second cathode pattern 4072 may be an area of a minimum circumscribed pattern of the first cathode pattern 4071. In an exemplary embodiment, the shape of the second cathode pattern 4072 in FIG. 20 is a rectangle, and the area of the second cathode pattern 4072 may equal to an area of a minimum circumscribed rectangle N of the first cathode pattern 4071 in FIG. 18 or 19.

Assuming that the second cathode pattern 4072 is proximal to the upper boundary of the display panel 40, since a second sub-pixel proximal to the boundary in the display panel 40 may not need to display an image, the second cathode pattern 4072 may not need to cover a light-emitting region of the second sub-pixels. In this case, the area of the second cathode pattern 4072 may be relatively small. For example, the display panel 40 may be manufactured by the mask 10 shown in FIG. 11.

Figure 23:
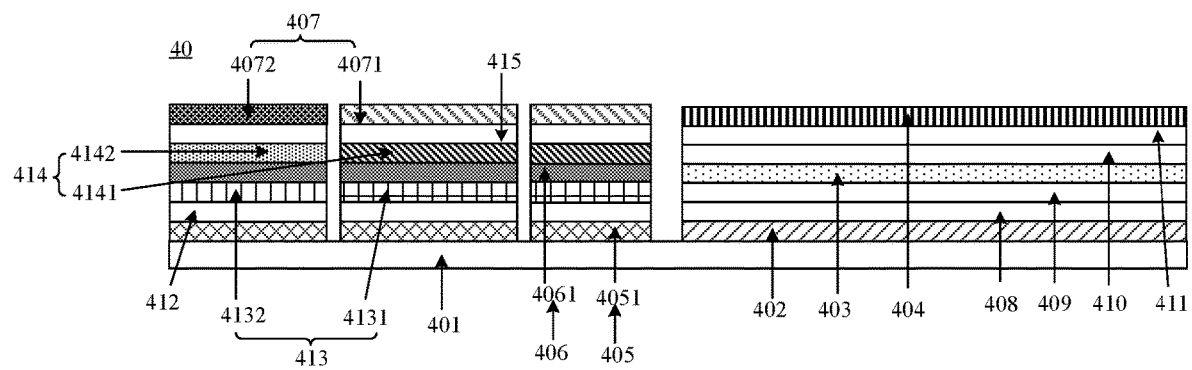
FIG. 23 is a schematic structural diagram of a display panel according to another embodiment of the present disclosure.

In this embodiment of the present disclosure, referring to FIG. 23, the display panel may further include a first hole injection layer 408, a first hole transport layer 409, a first electron transport layer 410 and a first electron injection layer 411 which are disposed in a first display region 401a, and a second hole injection layer 412, a second hole transport layer 413, a second electron transport layer 414 and a second electron injection layer 415 which are disposed in a second display region 401b.

The first anode layer 402, the first hole injection layer 408, the first hole transport layer 409, the first light-emitting layer 403, the first electron transport layer 410, the first electron injection layer 411, and the first cathode layer 404 are sequentially laminated in a direction away from the base substrate 401. The second anode layer 405, the second hole injection layer 412, the second hole transport layer 413, the second light-emitting layer 406, the second electron transport layer 414, the second electron injection layer 415, and the second cathode layer 407 are sequentially laminated in a direction away from the base substrate 401.

Each of the first hole injection layer 408 and the second hole injection layer 412 may include a plurality of hole injection patterns which are arranged at intervals. In addition, the first hole injection layer 408 and the second hole injection layer 412 may be manufactured by the FMM. Each of the first electron injection layer 411 and the second electron injection layer 415 may include a plurality of electron injection patterns which are arranged at intervals. In addition, the first electron injection layer 411 and the second electron injection layer 415 may be manufactured by the FMM.

In this embodiment of the present disclosure, the second hole transport layer 413 includes a plurality of first hole transport patterns 4131 and a plurality of second hole transport patterns 4132 which are arranged at intervals. The second electron transport layer 414 includes a plurality of first electron transport patterns 4141 and a plurality of second electron transport patterns 4142 which are arranged at intervals.

As an optional embodiment, an area of the first hole transport pattern 4131 is smaller than an area of the first cathode pattern 4071, and an area of the second hole layer transport pattern 4132 is smaller than an area of the second cathode pattern 4072. In addition, an area of the first electron transport pattern 4141 is smaller than an area of the first cathode pattern 4071, and an area of the second electron transport pattern 4142 is smaller than an area of the second cathode pattern 4072.

Since the area of the first hole transport pattern 4131 and the area of the first electron transport pattern 4141 are both smaller than the area of the first cathode pattern 4071, a target portion in the first cathode pattern 4071 is connected to a cathode signal line on the side, proximal to the base substrate 401, of the first hole transport pattern 4131 through a via hole. The target portion in the first cathode pattern 4071 refers to a portion, which is not overlapped with the first hole transport pattern 4131 and the first electron transport pattern 4141, in the first cathode pattern 4071.

In addition, since the area of the second hole transport pattern 4132 and the area of the second electron transport pattern 4142 are both smaller than the area of the second cathode pattern 4072, a target portion in the second cathode pattern 4072 is connected to a cathode signal line on the side, proximal to the base substrate 401, of the second hole transport pattern 4132 through a via hole. The target portion in the second cathode pattern 4072 refers to a portion, which is not overlapped with the second hole transport pattern 4132 and the second electron transport pattern 4142, in the second cathode pattern 4072.

As another optional embodiment, both an area of the first hole transport pattern 4131 and an area of the first electron transport pattern 4141 are equal to an area of the first cathode pattern 4071. However, in order to ensure that there is no overlapping region between the first cathode pattern 4071 and the first hole transport pattern 4131 and between the first cathode pattern 4071 and the first electron transport pattern 4141, a target portion in the first cathode pattern 4071 is connected to a cathode signal line on the side, proximal to the base substrate 401, of the first hole transport pattern 4131 through a via hole.

In this embodiment of the present disclosure, the shape of the first hole transport pattern 4131 may be set to be the same as the shape of the first electron transport pattern 4141, and the shape of the first hole transport pattern 4131 and the shape of the first electron transport pattern 4141 may be set to be different from the shape of the first cathode pattern 4071. The target portion in the first cathode pattern 4071 refers to a portion, which is not overlapped with the first hole transport pattern 4131 and the first electron transport pattern 4141, in the first cathode pattern 4071.

In an exemplary embodiment, the shape of the first cathode pattern 4071 is a first shape; and the shape of the first hole transport pattern 4131 is the same as the shape of the first electron transport pattern 4141, both of which are a second shape.

In addition, both an area of the second hole transport pattern 4132 and an area of the second electron transport pattern 4142 are equal to an area of the second cathode pattern 4072. However, in order to ensure that there is no overlapping region between the second cathode pattern 4072 and the second hole transport pattern 4132 and between the second cathode pattern 4072 and the second electron transport pattern 4142, a target portion in the second cathode pattern 4072 is connected to a cathode signal line on the side, proximal to the base substrate 401, of the second hole transport pattern 4132 through a via hole.

In this embodiment of the present disclosure, the shape of the second hole transport pattern 4132 may be set to be the same as the shape of the second electron transport pattern 4142, and the shape of the second hole transport pattern 4132 and the shape of the second electron transport pattern 4142 may be set to be different from the shape of the second cathode pattern 4072. The target portion in the second cathode pattern 4072 refers to a portion, which is not overlapped with the second hole transport pattern 4132 and the second electron transport pattern 4142, in the second cathode pattern 4072.

In an exemplary embodiment, the shape of the second cathode pattern 4072 is a second shape; and the shape of the second hole transport pattern 4132 is the same as the shape of the second electron transport pattern 4142, both of which are a first shape.

As yet another optional embodiment, the first hole transport pattern 4131, the first electron transport pattern 4141 and the first cathode pattern 4071 may be equal in shape and area. The second hole transport pattern 4132, the second electron transport pattern 4142 and the second cathode pattern 4072 may be equal in shape and area. In this case, the first hole transport layer 409, the first electron transport layer 410, the second hole transport layer 413, and the second electron transport layer 414 in the display panel may be manufactured by using the mask 10 provided by the above embodiment.

That is, the first hole transport layer 409 may be formed by a first mask region 102*a* in the mask 10. The first hole transport pattern 4131 is formed by first through holes a1 in the mask 10. The second hole transport pattern 4132 is formed by second through holes a2 in the mask 10.

Moreover, the first electron transport layer 410 may be formed by the first mask region 102*a* in the mask 10. The first electron transport pattern 4141 is formed by the first through holes a1 in the mask 10. The second hole transport pattern 4142 is formed by the second through holes a2 in the mask 10.

In this case, the first cathode pattern 4071 is not provided with a target portion (a portion that is not overlapped with the first hole transport pattern 4131 and the first electron transport pattern 4141), and thus fails to be connected to a cathode signal line on the side, proximal to the base substrate 401, of the first hole transport pattern 4131. In addition, the second cathode pattern 4072 is not provided with a target portion (a portion that is not overlapped with the second hole transport pattern 4132 and the second electron transport pattern 4142), and thus fails to be connected to a cathode signal line on the side, proximal to the base substrate 401, of the second hole transport pattern 4132.

Therefore, after the first cathode pattern 4071 and the second cathode pattern 4072 are manufactured, a cathode signal line may be manufactured by vapor deposition on the side, distal from the base substrate 401, of the first cathode pattern 4071 and the second cathode pattern 4072. The cathode signal line provides cathode signals for the first cathode pattern 4071 and the second cathode pattern 4072.

In summary, according to the display panel provided by the embodiment of the present disclosure, gaps are formed among the plurality of first cathode patterns and the plurality of second cathode patterns in the second cathode layer of the display panel, such that the transmittance of the display panel is higher, and an imaging effect of the camera is better.

Figure 24:
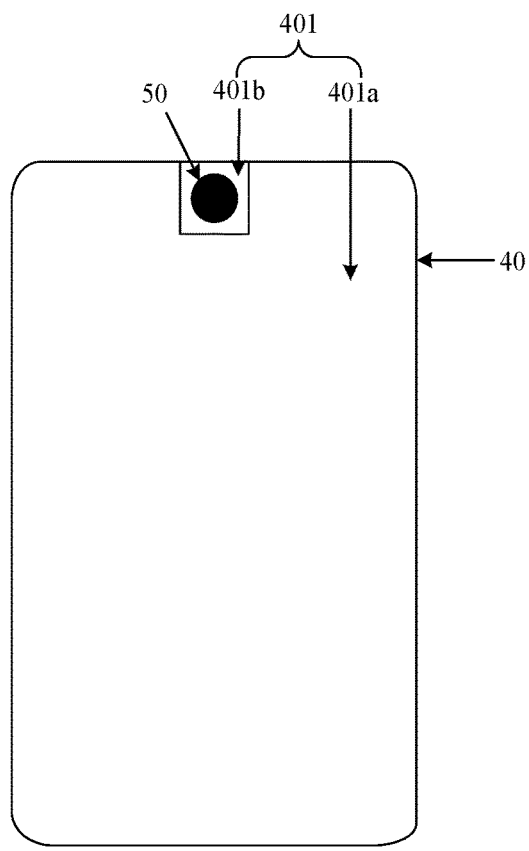
FIG. 24 is a schematic structural diagram of a display device according to an embodiment of the present disclosure.

FIG. 24 is a schematic structural diagram of a display device according to an embodiment of the present disclosure. As can be seen from FIG. 24, the display device may include an image sensor 50 and the display panel provided by the above embodiments. The image sensor 50 is disposed at the side, distal from a second anode layer, of a base substrate 401 in a display panel 40 and disposed in a second display region 401*b* of the base substrate 401. The image sensor 50 may be a front-facing camera of the display device, the front-facing camera being configured to for capture an image.

Optionally, the display device may be any product or component having a display function, such as an OLED display device, a liquid crystal display device, electronic paper, a mobile phone, a tablet computer, a television, a display, a notebook computer, a digital photo frame, a navigator or the like.

The above descriptions are merely embodiments of the present disclosure, and are not intended to limit the present disclosure. Any modifications, equivalent substitutions or improvements that are made within the spirit and principle of the present disclosure should all be included in the protection scope of claims of the present disclosure.

What is claimed is:

1. A mask comprising a mask frame and a mask body, wherein the mask body is fixed on the mask frame and comprises a first mask region and a second mask region;
   the second mask region comprises a first region and a second region; an area of the second region is smaller than an area of the first region; the second region is disposed away from a center of the second mask region relative to the first region; the first region is provided with a plurality of first through holes, and the second region is provided with a plurality of second through holes; the first through holes and the second through holes are arranged along a row direction and a column direction; each first through hole in the first region is provided with a first nearest though hole at each side in the row direction and is provided with a second nearest through hole at each side in the column direction; both the first nearest though hole and the second nearest through hole are first through holes;
   a first overlapping length is formed between the first through hole in the first region and the first nearest through hole in the column direction, the first overlapping length is greater than 70% of a length of the first through hole in the column direction; and a second overlapping length is formed between the first through hole in the first region and the second nearest through hole in the row direction, the second overlapping length is greater than 70% of a length of the first through hole in the row direction; and
   a shape of the first through hole is a first shape, and the first shape is an irregular shape, a shape of the second through hole is a second shape, and the second shape is a centrally symmetric pattern or an axially symmetric pattern; a ratio of a number of the second through holes to a number of the first through holes is less than or equal to 35%; and the first through holes and the second through holes are configured to manufacture cathode patterns of a cathode layer of sub-pixels in a display panel,
   wherein an orthogonal projection of the first through hole on base substrate covers an orthogonal projection of one sub-pixel group on the base substrate, the first shape is formed by a plurality of straight line segments and a plurality of arcuate line segments connected end to end,
   an extending direction of at least one straight line segment is parallel with an extending direction of a boundary of a light-emitting region of at least one second sub-pixel, and
   the sub-pixel group comprises one first-color second sub-pixel, two second-color second sub-pixels and one third-color second sub-pixel.

2. The mask according to claim 1, wherein an area of the second through hole is larger than or equal to an area of the first through hole.

3. The mask according to claim 1, wherein the shape of the second through hole is a rectangle, and the area of the second through hole is equal to an area of a minimum circumscribed rectangle of the first through hole.

4. The mask according to claim 1, wherein the shape of the second through hole is one of a circle, an ellipse, a rectangle, a triangle, a trapezoid, a parallelogram, a hexagon, an octagon and a cross.

5. The mask according to claim 1, wherein a shape of the second mask region is a rectangle and the second region comprises a plurality of sub-regions, each sub-region being a region proximal to a corner of the second mask region and each sub-region being provided with at least one second through hole.

6. The mask according to claim 5, wherein the second region comprises a plurality of sub-regions, each sub-region being a region proximal to a midpoint of a boundary of the second mask region and each sub-region being provided with at least one second through hole.

7. The mask according to claim 5, wherein the second region comprises a plurality of first sub-regions and a plurality of second sub-regions, each first sub-region being provided with at least one second through hole and each second sub-region being provided with at least one second through hole; wherein each first sub-region is a region proximal to a corner of the second mask region, and each second sub-region is a region proximal to a midpoint of a boundary of the second mask region.

8. The mask according to claim 5, wherein the second region is a strip-shaped region extending along at least one of the row direction and the column direction; wherein the row direction is parallel to an upper boundary of the second mask region, and the column direction is parallel to a left boundary of the second mask region.

9. The mask according to claim 8, wherein the second region comprises a third strip-shaped sub-region extending along the row direction, a fourth strip-shaped sub-region extending along the column direction, a fifth strip-shaped sub-region extending along the row direction and a sixth strip-shaped sub-region extending along the column direction;

the plurality of second through holes comprise a plurality of first-type second through holes disposed in the third sub-region and extending along the row direction, a plurality of second-type second through holes disposed in the fourth sub-region and extending along the column direction, a plurality of third-type second through holes disposed in the fifth sub-region and extending along the row direction and a plurality of fourth-type second through holes disposed in the sixth sub-region and extending along the column direction; and the third sub-region is close to the upper boundary of the second mask region relative to the first region; the fourth sub-region is close to the left boundary of the second mask region relative to the first region; the fifth sub-region is close to a lower boundary of the second mask region relative to the first region; and the sixth sub-region is close to a right boundary of the second mask region relative to the first region.

10. The mask according to claim 5, wherein a length of one of two vertical boundaries of the second mask region ranges from 2 mm to 10 mm, and a length of the other of the two vertical boundaries of the second mask region ranges from 2 mm to 15 mm.

11. The mask according to claim 5, wherein at least one boundary of the second mask region adjacent to the first mask region is saw-shaped.

12. A method for manufacturing a mask, applicable to a net tensioning device and comprising:

acquiring a mask frame and a mask body; and fixing the mask body on the mask frame, wherein the mask body comprises a first mask region and a second mask region; the second mask region comprises a first region and a second region; an area of the second region is smaller than an area of the first region; the second region is disposed away from a center of the second mask region relative to the first region; the first region is provided with a plurality of first through holes, and the second region is provided with a plurality of second through holes; the first through holes and the second through holes are arranged along a row direction and a column direction; each first through hole in the first region is provided with a first nearest though hole at each side in the row direction and is provided with a second nearest through hole at each side in the column direction; both the first nearest though hole and the second nearest through hole are first through holes;

a first overlapping length is formed between the first through hole in the first region and the first nearest through hole in the column direction, the first overlapping length is greater than 70% of a length of the first through hole in the column direction; and a second overlapping length is formed between the first through hole in the first region and the second nearest through hole in the row direction, the second overlapping length is greater than 70% of a length of the first through hole in the row direction; and a shape of the first through hole is a first shape, a shape of the second through hole is a second shape, and the second shape is a centrally symmetric pattern or an axially symmetric pattern; a ratio of a number of the second through holes to a number of the first through holes is less than or equal to 35%; and the first through holes and the second through holes are configured to manufacture cathode patterns of cathode layer of sub-pixels in a display panel, and the first shape is an irregular shape;

wherein fixing the mask body on the mask frame comprises:

obtaining plurality pieces of positional information by acquiring positional information of each second through hole in the mask body; and fixing the mask body on the mask frame based on the plurality pieces of positional information, wherein an orthogonal projection of the first through hole on base substrate covers an orthogonal projection of one sub-pixel group on the base substrate, the first shape is formed by a plurality of straight line segments and a plurality of arcuate line segments connected end to end, an extending direction of at least one straight line segment is parallel with an extending direction of a boundary of a light-emitting region of at least one second sub-pixel, and the sub-pixel group comprises one first-color second sub-pixel, two second-color second sub-pixels and one third-color second sub-pixel.

13. A display panel, comprising:
a base substrate comprising a first display region and a second display region disposed at a side of the first display region;
a first anode layer, a first light-emitting layer and a first cathode layer which are disposed in the first display region and are sequentially laminated away from a side of the base substrate; and
a second anode layer, a second light-emitting layer and a second cathode layer which are disposed in the second display region and are sequentially laminated away from the side of the base substrate,
wherein the first cathode layer is formed by a first mask region in a mask; the second cathode layer comprises a plurality of first cathode patterns and a plurality of second cathode patterns which are disposed at intervals; the first cathode pattern is formed by a plurality of first through holes in the mask; and the second cathode pattern is formed by a plurality of second through holes in the mask;
wherein the mask comprises a mask frame and a mask body, wherein the mask body is fixed on the mask frame and comprises the first mask region and a second mask region;
the second mask region comprises a first region and a second region; an area of the second region is smaller than an area of the first region; the second region is disposed away from a center of the second mask region relative to the first region; the first region is provided with the plurality of first through holes, and the second region is provided with the plurality of second through holes; the first through holes and the second through holes are arranged along a row direction and a column direction; each first through hole in the first region is provided with a first nearest though hole at each side in the row direction and is provided with a second nearest through hole at each side in the column direction; both the first nearest though hole and the second nearest through hole are first through holes;
a first overlapping length is formed between the first through hole in the first region and the first nearest through hole in the column direction, the first overlapping length is greater than 70% of a length of the first through hole in the column direction; and a second overlapping length is formed between the first through hole in the first region and the second nearest through hole in the row direction, the second overlapping length is greater than 70% of a length of the first through hole in the row direction; and
a shape of the first through hole is a first shape, and the first shape is an irregular shape, a shape of the second through hole is a second shape, and the second shape is a centrally symmetric pattern or an axially symmetric pattern; a ratio of a number of the second through holes to a number of the first through holes is less than or equal to 35%; and the first through holes and the second through holes are configured to manufacture cathode patterns of a cathode layer of sub-pixels in a display panel,
wherein the first anode layer, the first light-emitting layer and the first cathode layer are capable of being divided into a plurality of first sub-pixels; and the second anode layer, the second light-emitting layer and the second cathode layer are capable of being divided into a plurality of second sub-pixels;
an orthogonal projection of the first cathode pattern on the base substrate covers an orthogonal projection of light-emitting regions of one or more second sub-pixels on the base substrate;
an orthogonal projection of the second cathode pattern on the base substrate covers an orthogonal projection of light-emitting regions of one or more second sub-pixels on the base substrate,
wherein the plurality of second sub-pixels are capable of being divided into a plurality of sub-pixel groups; the sub-pixel groups comprise the second sub-pixels; and light-emitting regions of the plurality of second sub-pixels in the sub-pixel groups are arranged in 3 rows*3 columns,
the orthogonal projection of the first cathode pattern on the base substrate covers an orthogonal projection of one sub-pixel group on the base substrate; a shape of the first cathode pattern is a first shape formed by a plurality of straight line segments and a plurality of arcuate line segments connected end to end,
an extending direction of at least one straight line segment is parallel with an extending direction of a boundary of a light-emitting region of at least one second sub-pixel, and
the sub-pixel group comprises one first-color second sub-pixel, two second-color second sub-pixels and one third-color second sub-pixel.

14. The display panel according to claim 13, wherein for each sub-pixel group, a light-emitting region of the first-color second sub-pixel is disposed in a third row and a first column, a light-emitting region of one of the two second-color second sub-pixels is disposed in a first row and a third column, a light-emitting region of the other one of the two second-color second sub-pixels is disposed in the third row and the third column, and a light-emitting region of the third-color second sub-pixel is disposed in a second row and a second column.

15. The display panel according to claim 13, wherein for each sub-pixel group, a light-emitting region of the first-color second sub-pixel is disposed in a second row and a third column, a light-emitting region of one of the two second-color second sub-pixels is disposed in a first row and a second column, a light-emitting region of the other one of the two second-color second sub-pixels is disposed in the third row and the second column, and a light-emitting region of the third-color second sub-pixel is disposed in the second row and the first column.

16. The display panel according to claim 13, wherein a number of the light-emitting regions of the second sub-pixels covered by the first cathode pattern is the same as a number of the light-emitting regions of the second sub-pixels covered by the second cathode pattern.

17. The display panel according to claim 13, wherein the second cathode layer further comprises a plurality of third cathode patterns disposed at intervals,
wherein a number of light-emitting regions of the second sub-pixels covered by the third cathode patterns is less than the number of the light-emitting regions of the second sub-pixels covered by the first cathode pattern, and the number of light-emitting regions of the second sub-pixels covered by the third cathode patterns is less than the number of the light-emitting regions of the second sub-pixels covered by the second cathode pattern.

18. The display panel according to claim 13, further comprising a first hole transport layer and a first electron transport layer which are disposed in the first display region, and a second hole transport layer and a second electron transport layer which are disposed in the second display region,
- wherein the second hole transport layer comprises a plurality of first hole transport patterns and a plurality of second hole transport patterns which are disposed at intervals; an area of the first hole transport patterns is smaller than or equal to an area of the first cathode pattern; an area of the second hole transport patterns is smaller than or equal to an area of the second cathode pattern;
- the second electron transport layer comprises a plurality of first electron transport patterns and a plurality of second electron transport patterns which are disposed at intervals; an area of the first electron transport patterns is smaller than or equal to the area of the first cathode pattern; an area of the second electron transport patterns is smaller than or equal to the area of the second cathode pattern.

19. A display device comprising an image sensor and the display panel as defined in claim 13, wherein
- the image sensor is disposed at a side, distal from the second anode layer, of the base substrate of the display panel and is disposed in the second display region of the base substrate.

* * * * *